(12) United States Patent
Goto et al.

(10) Patent No.: US 7,632,379 B2
(45) Date of Patent: Dec. 15, 2009

(54) PLASMA SOURCE AND PLASMA PROCESSING APPARATUS

(75) Inventors: Toshio Goto, 3-2110, Goshikien, Nisshin-shi, Aichi (JP) 470-0105; Masaru Hori, 6-176, Fujitsuka, Nisshin-shi, Aichi (JP) 470-0100; Nobuo Ishii, Kobe (JP); Shoji Den, Kawasaki (JP)

(73) Assignees: Toshio Goto, Nisshin-shi (JP); Masaru Hori, Nisshin-shi (JP); Tokyo Electron Limited, Minato-ku, Tokyo (JP); Katagiri Engineering Co., Ltd., Kawasaki-shi (JP)

(*) Notice: Subject to any disclaimer, the term of this patent is extended or adjusted under 35 U.S.C. 154(b) by 564 days.

(21) Appl. No.: 10/558,692

(22) PCT Filed: May 28, 2004

(86) PCT No.: PCT/JP2004/007380

§ 371 (c)(1),
(2), (4) Date: Nov. 30, 2005

(87) PCT Pub. No.: WO2004/107825

PCT Pub. Date: Dec. 9, 2004

(65) Prior Publication Data

US 2007/0017636 A1    Jan. 25, 2007

(30) Foreign Application Priority Data

May 30, 2003  (JP) ............................. 2003-155142
May 30, 2003  (JP) ............................. 2003-155249
May 30, 2003  (JP) ............................. 2003-155352

(51) Int. Cl.
*C23F 1/00*    (2006.01)
*H01L 21/306*    (2006.01)
*C23C 16/00*    (2006.01)

(52) U.S. Cl. .............................. 156/345.44; 118/723 E
(58) Field of Classification Search ................ 118/722, 118/723 R, 723 E; 156/345.43
See application file for complete search history.

(56) References Cited

U.S. PATENT DOCUMENTS 6,350,961 B1    2/2002  Jung
2003/0049468 A1*    3/2003  Hu et al. ..................... 428/451

(Continued)

FOREIGN PATENT DOCUMENTS

JP    62-159419 A    7/1987

(Continued)

OTHER PUBLICATIONS

International Search Report dated Sep. 7, 2004 with English Translation thereof. (Four (4) pages).

*Primary Examiner*—Parviz Hassanzadeh
*Assistant Examiner*—Maureen Gramaglia
(74) *Attorney, Agent, or Firm*—Crowell & Moring LLP

(57) ABSTRACT

A plasma source (1) is composed of a chamber (2) to which a gas should be supplied and a hollow cathode electrode member (4) which is arranged on the gas flow-out side of the chamber (2) and has a plurality of electrode holes (3) through which the gas can flow. In such a plasma source (1), microcathode plasma discharge can be performed in the electrode holes (3) of the hollow cathode electrode member (4).

12 Claims, 20 Drawing Sheets

U.S. PATENT DOCUMENTS

| | | | |
|---|---|---|---|
| 2003/0052096 A1* | 3/2003 | Crowe et al. | 219/121.43 |
| 2006/0042545 A1* | 3/2006 | Shibata et al. | 118/722 |

FOREIGN PATENT DOCUMENTS

| | | |
|---|---|---|
| JP | 06-163467 A | 6/1994 |
| JP | 06-216078 A | 8/1994 |
| JP | 07-058087 A | 3/1995 |
| JP | 07-073994 A | 3/1995 |
| JP | 07-106311 A | 4/1995 |
| JP | 10-053877 A | 2/1998 |
| JP | 10-144669 A | 5/1998 |
| JP | 2000-036634 A | 2/2000 |
| JP | 2000-057934 A | 2/2000 |
| JP | 2001-226775 A | 8/2001 |
| JP | 2001-526325 A | 12/2001 |
| JP | 2002-289399 A | 10/2002 |
| JP | 2002-370059 A | 12/2002 |
| JP | 2003-234335 A | 8/2003 |
| JP | 2004-158839 A | 6/2004 |
| JP | 2004-227990 A | 8/2004 |

* cited by examiner

EMISSION INTENSITY OF VISIBLE LIGHT POWER MONITOR
DISCHARGE OF CATHODE ELECTRODES (A) AND (B) : 41.4nW
DISCHARGE OF CATHODE ELECTRODES (A),(B) AND (C) : 61.2nW

EMISSION INTENSITY OF VISIBLE LIGHT POWER MONITOR
DISCHARGE OF CATHODE ELECTRODES (A) AND (B) : 41.4nW
DISCHARGE OF CATHODE ELECTRODES (A),(B) AND (C) : 61.2nW

STRUCTURE OF ELECTRODE

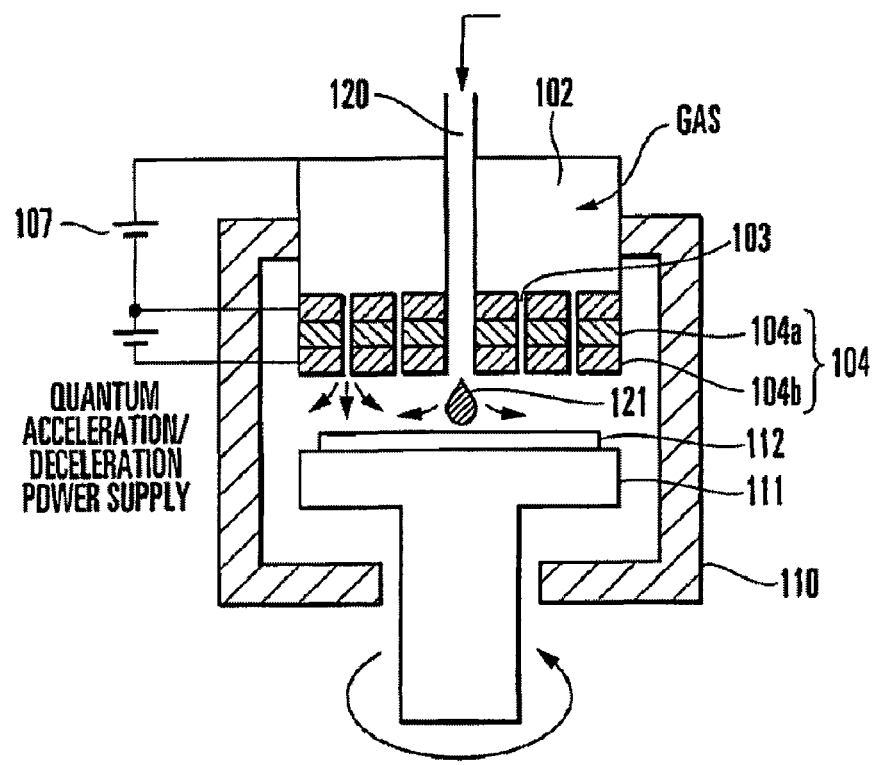
FIG. 24
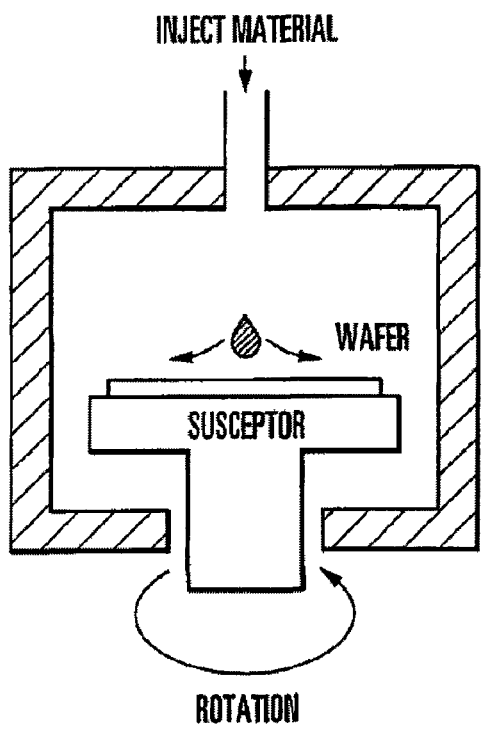
PRIOR ART  FIG. 25

CW MICROWAVE-EXCITED NONAVERAGE ATMOSPHERIC-PRESSURE PLASMA ETCHING APPARATUS

PLASMA SOURCE AND PLASMA PROCESSING APPARATUS

TECHNICAL FIELD

The present invention relates to a plasma source and plasma processing apparatus which enable highly efficient plasma generation.

BACKGROUND ART

The present invention can be widely and generally applied to the manufacture of the material of a semiconductor or an electronic device such as a semiconductor device or liquid crystal device, and will be described exemplifying the background art of the semiconductor device for descriptive convenience.

In recent years, as the integration density of the semiconductor device increases and the feature size of the semiconductor device shrinks, in the semiconductor device manufacturing process, a plasma processing apparatus is used more and more often in order to perform various types of processes such as film deposition, etching, and ashing. When such a plasma process is employed, a general advantage is obtained in that highly accurate process control can be performed in an electronic device manufacturing process.

Conventionally, as a plasma processing apparatus to generate a plasma necessary for the various types of processes described above, a CCP (Capacitively Coupled Plasma) processing apparatus and ICP (Inductively Coupled Plasma) processing apparatus have been used (see patent references 1 and 2).

Of the two types of apparatuses, in the CCP processing apparatus, usually, a process chamber is usually employed which incorporates, as an upper electrode that forms one parallel plate, an Si top plate having a shower head structure to provide a more uniformed process gas flow, and a susceptor which can apply a bias to a lower electrode serving as the other parallel plate. In the plasma processing in this case, a substrate (target object) to be processed is placed on the susceptor. A plasma is generated between the upper and lower electrodes described above. The substrate is subjected to a desired process with the generated plasma.

In the CCP processing apparatus, however, the plasma density is low when compared to those of other plasma sources, and a sufficient ion flux is difficult to obtain. Accordingly, the processing rate for the target object (wafer or the like) tends to be low. Even when the frequency of the power supply for the parallel plates is increased, a potential distribution appears within an electrode surface that constitutes each parallel plate, so that the uniformity of the plasma and/or process tends to decrease. In addition, in the CCP processing apparatus, the Si electrode consumes fast, and accordingly the COC (Cost of Consumable) tends to increase.

In the ICP processing apparatus, usually, a turn coil to which a high frequency is to be supplied is arranged on a dielectric top plate (i.e., outside a process chamber) which is located on the upper side of the process chamber. The arranged coil causes induction heating to generate a plasma immediately under the top plate. The target object is processed with the generated plasma.

In the conventional ICP processing apparatus, a high frequency is supplied to the turn coil outside the process chamber (through the dielectric top plate) to generate a plasma in the process chamber. When the diameter of the substrate (target object) increases, the process chamber needs a mechanical strength for the purpose of vacuum sealing. The thickness of the dielectric top plate must accordingly be increased, thus increasing the cost. In addition, when the thickness of the dielectric top plate increases, the power transmission efficiency from the turn coil to the plasma decreases. Therefore, the voltage of the coil must be set high.

As a result, the dielectric top plate itself tends to be sputtered to degrade the COC described above. Furthermore, fine particles generated by sputtering are deposited on the substrate to likely degrade the process performance. The size of the turn coil itself must also be increased. To supply power to such a large-size coil, a high-output power supply is required.

In the conventional plasma process, power is supplied to a plasma chamber to which a gas is supplied, so as to plasmatize the gas, thus processing the base material set in the plasma chamber. The plasma process has been designed such that uniform power is supplied particularly to the electrode to generate a spatially uniform plasma. The plasma uniformity, however, is largely influenced by the electrode shape, the structure or the like of the plasma chamber, and parameters such as the pressure and gas species. Therefore, it is difficult to obtain an even plasma distribution that matches various process conditions.

Also, it is impossible to freely change the plasma generation area or the like. For example, assume that a base material having an area substantially equal to that of the plasma generation space and a base material having an area much smaller than that of the plasma generation space are to be processed. In this case, the plasma generation space must match the area of the larger base material. When coping with the base material having the smaller area, even though most of the plasma generation area is not used, the process is generally performed using a large-area plasma.

A particle beam processing apparatus is available in which various types of particles are selectively guided from a plasma source to a process chamber to process a base material in the process chamber. In this apparatus, however, the density of the plasma source cannot be sufficiently increased under a desired pressure, and the density of the particles to be radiated cannot be increased sufficiently. It is also difficult to spatially control the particles so as to selectively irradiate a desired portion of the base material.

Another plasma processing apparatus is available in which, in order to increase the plasma generation efficiency, a plasma chamber to which a gas is supplied is connected to a plasma particle generation power supply to plasmatize the gas under the atmospheric pressure, so as to process a base material in the chamber with the plasma. This atmospheric-pressure plasma processing apparatus is advantageous in that a plasma having a higher density can be obtained more easily than with a conventional reduced-pressure plasma processing apparatus.

In the atmospheric-pressure plasma processing apparatus, however, as the pressure is high, the dynamic range of the particle acceleration/deceleration energy is narrow.

The present applicant could not find any precedent technical reference, before the application, related to the present invention other than those specified by precedent technical reference information described in this specification.

Patent Reference 1:
  Japanese Patent Laid-Open No. 6-163467
Patent Reference 2:
  Japanese Patent Laid-Open No. 7-058087

DISCLOSURE OF INVENTION

Problem To Be Solved By The Invention

As described above, according to the prior art, a plasma source or plasma processing apparatus that can generate a high-density plasma highly efficiently is not realized.

It is an object of the present invention to provide a plasma source or plasma processing apparatus in which the drawbacks of the prior arts described above are solved.

It is another object of the present invention to provide a plasma source or plasma processing apparatus which can generate a high-density plasma highly efficiently.

It is still another object of the present invention to provide a plasma source or plasma processing apparatus which can radiate high-density particles.

It is still another object of the present invention to provide a plasma source or plasma processing apparatus which can be controlled in time and space.

Means of Solution to the Problem

The present inventors conducted extensive studies and found that to perform plasma discharge in holes of a hollow cathode electrode member through which a gas could flow was very effective in achieving the above objects.

A plasma source according to the present invention is base on the above findings and, more particularly, is a plasma source comprising at least a chamber to which a gas should be supplied, and a hollow cathode electrode member which is arranged on a gas flow-out side of the chamber and has a plurality of electrode holes through which the gas can flow, characterized in that microcathode plasma discharge can be performed in the electrode holes many marks of the hollow cathode electrode member. Four-dimensional (space+time) control is performed to generate a plasma.

According to the present invention, there is also provided a plasma processing apparatus comprising at least a process chamber, base material holding means for arranging a base material at a predetermined position in the process chamber, and a plasma source to selectively irradiate the base material with a plasma (or a charged particle or radical selectively); characterized in that the plasma source includes at least a chamber to which a gas should be supplied, and a hollow cathode electrode member which is arranged on a gas flow-out side of the chamber and has a plurality of electrode holes through which the gas can flow, and microcathode plasma discharge can be performed in the electrode holes of the hollow cathode electrode member.

According to a preferred aspect of the present invention, the electrode described above comprises a multistage (two or more stages) electrode element.

According to another preferred aspect of the present invention, a plasma source or plasma processing apparatus which is controllable four-dimensionally (three spatial dimensions+time) is provided.

Effect of the Invention

As described above, according to the present invention, there is provided a plasma source or plasma processing apparatus which can generate a high-density plasma highly efficiently.

BRIEF DESCRIPTION OF DRAWINGS

FIG. 24 is a sectional view schematically showing an arrangement example of a coating apparatus which uses a plasma source according to the present invention.

FIG. 25 is a sectional view showing the arrangement of a conventional coating apparatus.

BEST MODE FOR CARRYING OUT THE INVENTION

The embodiments of the present invention will be described with reference to the drawings when necessary. In the following description, note that "part" and "%" which indicate an amount and ratio are based on the mass standard, unless otherwise specified.

(One Embodiment of Plasma Source)

Figure 2:
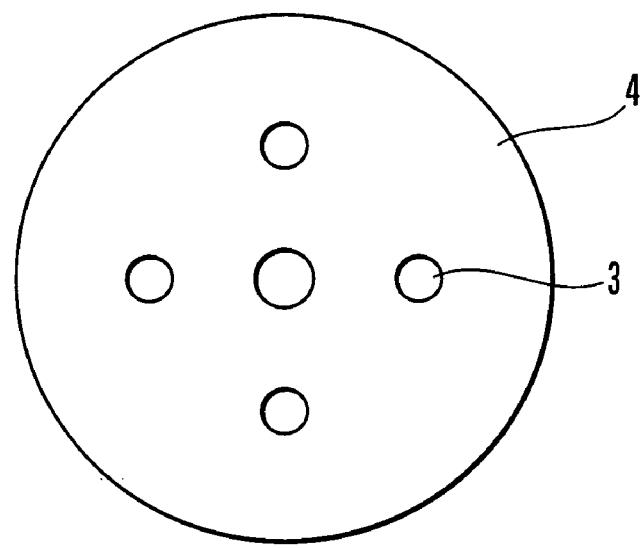
FIG. 2 is a plan view showing the arrangement of a hollow cathode electrode member 4.
Figure 3:
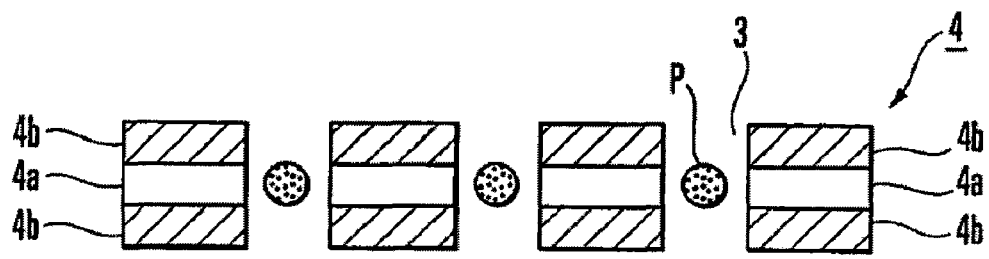
FIG. 3 is a sectional view sowing the arrangement of the hollow cathode electrode member 4.

One embodiment of a plasma source according to the present invention will be described with reference to the schematic sectional view of FIG. 1, the schematic plan view of FIG. 2, and the partial schematic sectional views of FIGS. 3 and 4. For the sake of comparison, FIG. 5 shows a schematic sectional view of a conventional plasma source (which plasmatizes a gas in a plasma preliminary chamber).

Figure 1:
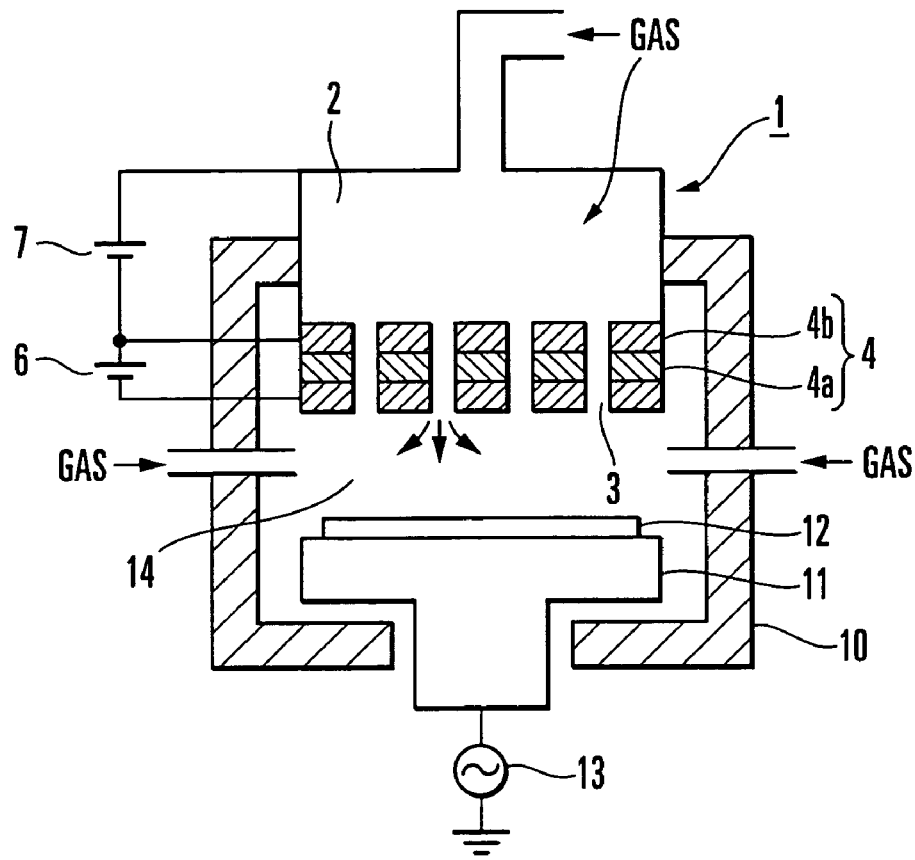
FIG. 1 is a schematic sectional view showing an embodiment of a plasma processing apparatus which is configured to incorporate a plasma source according to the present invention.

FIG. 1 is a schematic sectional view showing an embodiment of a plasma processing apparatus which is configured to incorporate a plasma source according to the present invention. A plasma source 1 shown in FIG. 1 incorporates a chamber 2 to which a gas should be supplied and a hollow cathode electrode member 4 which is arranged on the gas flow-out side of the chamber 2 and has a plurality of electrode holes 3 through which the gas can flow. Referring to FIGS. 2 and 3, the hollow cathode electrode member 4 comprises pairs of porous conductor members 4b which are combined through dielectric porous spacers 4a.

As shown in FIG. 1, a DC power supply 6 is connected to be able to apply a voltage between each pair of porous conductor members 4b. A DC power supply 7 is also connected to be able to apply a voltage between each porous conductor member 4b and the chamber 2. Thus, the voltage is applied between each pair of porous conductor members 4b, while flowing a gas through the electrode holes 3, to start DC-driven microcathode discharge, thereby generating a plasma in regions P shown in FIG. 3.

The plurality of pairs of porous conductor members 4b are set in the vertical direction, and a voltage is externally applied to the respective pairs independently of each other. When the plasma is generated, electrons collide against the inner walls of the electrode holes 3 to emit electrons (secondary electrons) from the inner walls of the electrode holes 3 by a γ (gamma) function. According to the present invention, the electrons are emitted from the inner walls of the electrode holes 3 by the γ function, and the emitted electrons collide against next molecules to ionize the molecules. This α (alpha) function maintains discharge.

Alternatively, an electrode may be arranged to be electrically separated from the chamber 2, and a DC or AC electric field may be applied between the arranged electrode and the chamber 2 to generate a plasma in the chamber 2. Microwaves may also be used. To enhance the γ function, as the metal that forms the electrode portion, a member which has a high plasma resistance and efficiently generates secondary electrons is used. Alternatively, the electrode portion can be coated with carbon nanotubes.

When necessary, the surface of the electrode portion may be coated with a metal material or the like having a small work function, e.g., Cs or Os that has a high efficiency of electron emission from the surface, as needed. Also, a structure may be possible in which the surface of the electrode metal is coated with an insulator to decrease the apparent work function. In the case of DC discharge, such coating can be appropriately adjusted or removed.

Figure 4:
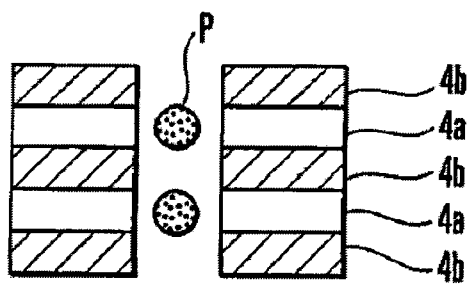
FIG. 4 is a sectional view showing the arrangement of a hollow cathode electrode member according to another embodiment.
Figure 5:
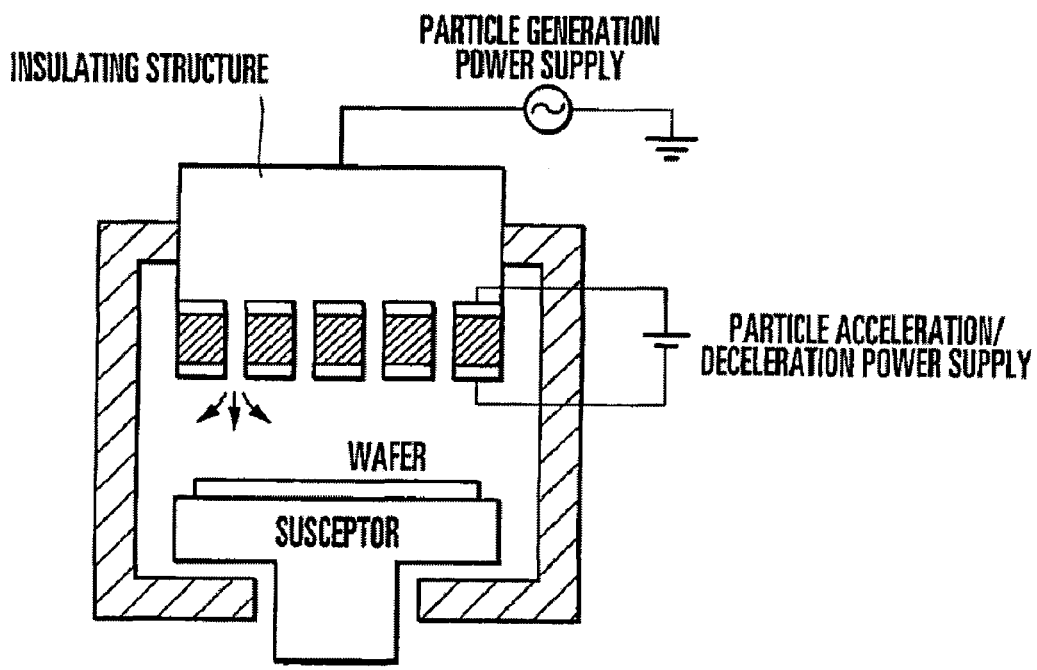
FIG. 5 is a sectional view showing the arrangement of a conventional plasma processing apparatus configured to incorporate a conventional plasma source.

As shown in the partial schematic sectional view of FIG. 4, the hollow cathode electrode member 4 described above may have the plurality of pairs of porous conductor members 4b, when necessary, which are combined through the porous spacers 4a. This embodiment having the plurality of pairs of porous conductor members 4b in this manner can control the energy of the charged particles and prevent a decrease in the energy of the charged particles while passing through the holes. The electrode holes 3 are extracting electrodes. When a voltage is applied to the extracting electrodes appropriately, plasma charged particles (positive/negative ions) and radicals can be extracted. The plurality of electrode holes 3 may be distributed so that the plasma, charged particles, and radicals extracted from the electrode holes 3 distribute substantially uniformly on an electronic machinery.

(Plasma Processing Apparatus)

The plasma processing apparatus according to the present invention incorporates at least a process chamber 10, a base material holding means 11 for arranging a base material 12 for an electronic device or the like at a predetermined position in the process chamber 10, and the plasma source having the arrangement described above to irradiate the base material 12 for the electronic device or the like with a plasma (or charged particles or radicals selectively).

In the embodiment of the plasma processing apparatus shown in FIG. 1, the target object (e.g., a wafer) 12 on the susceptor (base material holding means) 11 which is arranged in the process chamber 10 loaded with the plasma source 1 according to the present invention can be processed with the plasma by plasma generation based on microcathode discharge in the electrode holes 3. A bias power supply 13 is connected to the susceptor 11 to be able to apply a predetermined voltage (e.g., an RF voltage) to the susceptor 11.

An electrode may be arranged to be electrically separated from a lower chamber space 14, and a DC or AC electric field may be applied between the arranged electrode and the chamber to generate a plasma in the chamber 14. Microwaves may also be used. At this time, electrons, radicals, and ions can be injected from a plasma generated by microcathode discharge into the plasma generated in the chamber 14. The base material 12 can be processed with the plasma containing the injected particles.

The plasma source having the arrangement described above according to the present invention can generate a plasma based on good microcathode discharge relatively without being influenced by a gas pressure under which the plasma source is driven. In other words, the plasma source according to the present invention can easily realize an atmospheric-pressure plasma (with a pressure of about 101.3 kPa; densities of the electrons, ions, and radicals are generally about $10^{15}/cm^3$) having a prodigiously higher density than that of a so-called low-pressure plasma (with a pressure of about 0.133 Pa to 13.3 Pa; densities of electrons, ions, and radicals are generally about $10^{11}$ to $10^{12}/cm^3$). When such an atmospheric-pressure plasma is used, stable discharge can be performed under the atmospheric pressure, so that a so-called non-equilibrium plasma having an electron temperature higher than the gas temperature can be suitably realized.

In contrast to this, in the conventional plasma source or plasma processing apparatus as shown in FIG. 5, it is generally difficult to decrease the conductance and increase the pressure in the plasma preliminary chamber. As the pressure in the preliminary chamber is a low gas pressure, a high-density plasma is difficult to obtain (the plasma generation space is large and accordingly the apparatus becomes bulky), and while the charged particles or radicals pass through the holes, their density tends to decrease. Also, the dynamic range of the particle acceleration/deceleration energy is small. As particle acceleration/deceleration is applied to the electrode uniformly, spatially independent control is impossible to perform.

(Arrangement of Respective Portions)

The respective portions and the like that constitute the plasma source or plasma processing apparatus according to the present invention will be described in detail.

(Chamber)

Regarding the chamber 2 shown in FIG. 1 to which the gas is to be supplied, as far as a gas for plasma generation can be supplied into the chamber 2 and the plasma source can be arranged on the gas flow-out side, the structure, size, material, and the like of the chamber 2 are not particularly limited. An electrode may be arranged to be electrically insulated from the chamber 2 so as to generate a plasma in the chamber 2.

(Hollow Cathode Electrode)

The hollow cathode electrode 4 has the plurality of electrode holes 3. As far as plasma generation in the electrode holes 3 is possible, the number and size of the electrode holes 3, the thickness of the hollow cathode electrode member 4, and the like are not particularly limited. To obtain low conductance, preferably, the sum (S) of the hole areas and the hole length (L) establish a certain relationship. $S \leq \alpha \cdot L$. According to the present invention, a relationship (metal thickness)>(insulator thickness) is preferably satisfied in the microcathode. This is because the area of the electrode hollow cathode increases and accordingly electrons are readily generated from the surface of the hollow cathode electrode, which is advantageous in terms of an increase and stabilization of discharge volume.

(Porous Spacer Member)

As described above, the hollow cathode electrode 4 includes at least one set of a pair of porous conductor members combined through a dielectric porous spacer member. As far as plasma generation in the electrode holes 3 is possible, the material, size, thickness, and the like of the porous spacer member 4a are not particularly limited. In terms of prevention of leakage between the electrodes or abnormal discharge, the porous spacer member 4a preferably has the following arrangement.

Material of porous spacer member 4a:
  $SiO_2$, $Al_2O_3$, AlN, BN, BNC, or the like
Size: Dielectric hole diameter≧Electrode hole diameter
Thickness: Sufficient to prevent leakage and dielectric breakdown and to obtain an appropriate discharge space.

According to the present invention, the electrode may be made of SUS and carbon nanotubes may be grown on the electrode made of SUS. Alternatively, the electrode may be coated with Cs, Os, or the like having high electron emissivity.

(Porous Conductor Member)

As far as plasma generation in the electrode holes 3 is possible, the material, size, thickness, and the like of the porous conductor members 4b are not particularly limited.

The material of the porous conductor members 4b is preferably Si, SUS, Mo, W, or the like. The thickness of each member 4b is preferably 1 μm or more.

(Gas)

The gas that can be used in the present invention and should be supplied into the chamber 2 is not particularly limited, and various types of gases can be used in accordance with the objects of the plasma process. More specifically, when the plasma process is etching, an etching gas can be used. When the plasma process is film deposition, a film deposition gas can be used. In addition, various types of inert gases (e.g., a rare gas) can be used as a plasma generation gas. Gases that can be suitably used in the present invention are as follows.
Plasma generation gas: Ar, He, $H_2$, $N_2$, Xe, Kr, Ne
Etching gas: $CF_4$, $C_4F_8$, $C_4F_6$, $NF_3$, $H_2O$, $SF_6$, $Cl_2$, $O_2$, $Br_2$, $NH_3$
Film deposition gas: $SiH_4$, $CH_4$, $C_2H_2$, organic gas Of the above gases, as the plasma generation gas, Kr or Xe is preferably used in terms of plasma stability because it decreases a discharge maintaining voltage.

(Plasma Generation Principle)

According to the present invention, as far as plasma generation in the electrode holes 3 is possible, the plasma generation principle is not particularly limited. More specifically, while a DC voltage is applied between the pair of porous conductor members 4b in the embodiment of FIG. 1 described above, the DC voltage can be replaced by microwaves or alternating current (high-frequency RF, VHF, or UHF).

In the embodiment wherein the DC voltage is applied, the following condition can be suitably employed.
Voltage: 1 kV or more In the embodiment wherein microwaves (e.g., 2.45 GHz) are applied, the following condition can be suitably employed.

Microwaves: preferably 0.5 $W/cm^2$. The microwaves may be adjusted when necessary in accordance with the electrode area (Base Material for Electronic Device or the Like)

When the plasma source or plasma processing apparatus according to the present invention is employed, the base material (e.g., base materials for various types of electronic devices or the like; e.g., a wafer) can be processed with a plasma. Application to processes such as etching, deposition, a surface process, or the like using plasma charged particles or radicals is possible. The base material for the electronic device or the like described above that can be used in the present invention is not particularly limited, and one type or a combination of two or more types of known base materials for electronic devices or the like can be selectively used. An example of such a base material for an electronic device or the like includes a semiconductor material, liquid crystal device material, organic material, and the like. An example of the semiconductor material includes a material containing single-crystal silicon as a major component, poly-crystal Si, an $SiO_2$ oxide, and the like.

Other Embodiments

Figure 6:
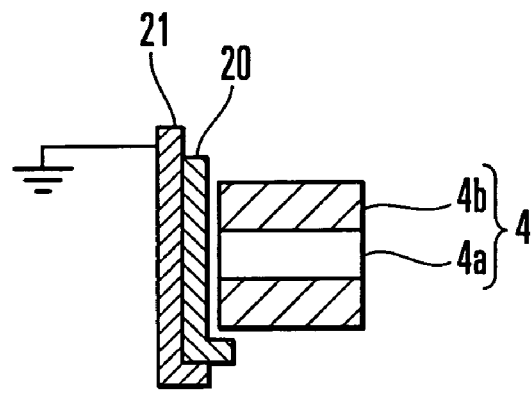
FIG. 6 is a sectional view showing the arrangement of a hollow cathode electrode member according to another embodiment.
Figure 7:
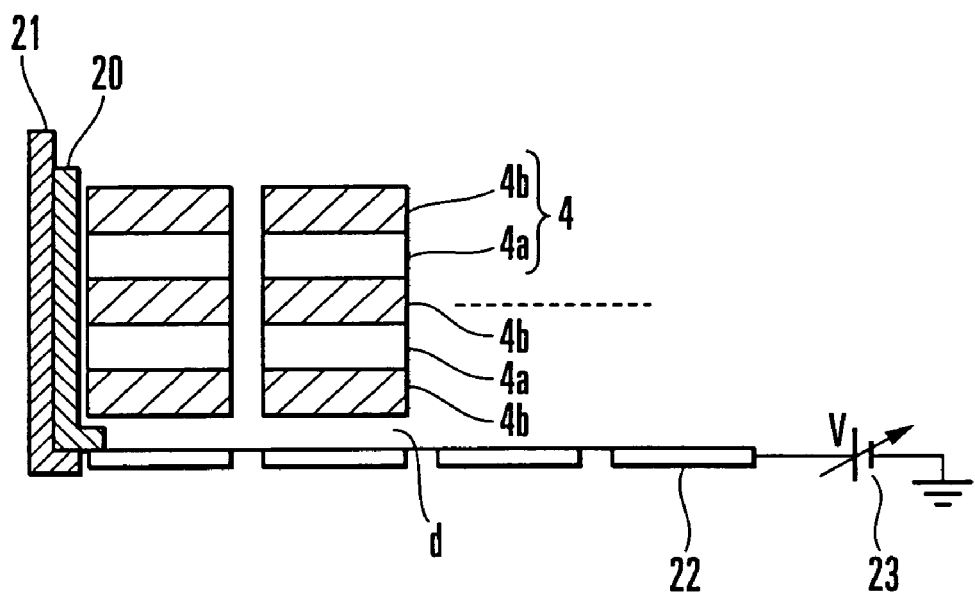
FIG. 7 is a sectional view showing the arrangement of a hollow cathode electrode member according to still another embodiment.

The partially sectional schematic views of FIGS. 6 and 7 show a hollow cathode electrode 4 according to other embodiments. In the embodiment shown in FIG. 6, a hollow cathode electrode 4 comprising a pair of porous conductor members 4b combined through a porous spacer member 4a is attached to a grounded metal member 21 through a dielectric 20. Except for this, the arrangement of the embodiment shown in FIG. 6 is the same as that shown in FIG. 1. In the arrangement shown in FIG. 6, the porous spacer member 4a is made of a dielectric such as alumina ($Al_2O_3$) or quartz, and the porous conductor members 4b are made of a metal such as Si, Cu, Mo. W, or SUS.

Referring to FIG. 7, a hollow cathode electrode 4 comprising a plurality of pairs of porous conductor members 4b combined through porous spacers 4a is attached to a grounded metal member 21 through a dielectric 20, and an extracting electrode 22 is arranged under the hollow cathode electrode 4. Except for this, the arrangement of FIG. 7 is the same as that of the embodiment shown in FIG. 1.

The extracting electrode 22 is grounded through a variable-voltage power supply 23. A voltage V is applied to the extracting electrode 22. When the voltage V=0 or a floating potential, radicals or a plasma is extracted from the extracting electrode 22. When the voltage V>0, electrons or negatively charged ions are extracted from the extracting electrode 22. When the voltage V<0, positively charged ions are extracted from the extracting electrode 22. When extracting the plasma, the extracting electrode 22 can be omitted. In the process of extracting positive/negative ions, the positive/negative ions may be collided against the side wall to neutralize the ions, so that radicals having an energy are extracted.

In the embodiment of FIG. 7, a distance d between the extracting electrode 22 and the porous conductor member 4b which is the closest to the extracting electrode 22 is preferably about 1 mm to 10 mm, although it depends on the operating condition of the hollow cathode electrode 4 and/or extracting electrode 22.

According to the present invention, the particle density can be greatly increased to stabilize discharge. From the viewpoint of controlling the particles four-dimensionally (time and space) to enable radiation, the microcathode is preferably a "multistage" (preferably three sages or more) microcathode. From the viewpoint of increasing the plasma characteristics, a multistage microcathode having three or more electrodes is preferable. When a single-stage microcathode is employed, a "pressure difference" is preferably provided between the gas supply side and plasma generation side from the viewpoint of increasing the process dynamics.

In the plasma source of the present invention, the high pressure side can be at the atmospheric pressure. The plasma generation side can be at the atmospheric pressure, or a pressure lower than the atmospheric pressure. In terms of plasma generation efficiency, preferably, the pressure at any one (and furthermore two) of the gas supply side and plasma generation side is high.

The microcathode source according to the present invention can be used alone as a plasma source, and can be combined with a conventional plasma generating means (e.g., parallel plates) when necessary. When the microcathode source is combined with the conventional plasma generating means in this manner, various types of particles can be injected into a conventional plasma process. This provides an advantage that the process performance can be greatly improved under the conventional process conditions.

Furthermore, a large number of microcathodes may be planarly provided. Using the holes of the plurality of microcathodes as "addresses", control operation using a computer or the like may be performed, to adjust turn on/off of the respective holes, or the plasma intensity and/or its planar distribution.

A plasma having a shape that matches the shape of a substrate to be plasma-processed can be generated by the planar control of the plasma intensity described above. Planar control of the plasma intensity enables selective etching (e.g., etching that does not use a resist) of the substrate.

In the electrodes of a multistage microcathode, potentials to be applied to the respective electrodes may be differed to adjust the plasma intensity in the vertical direction. In this case, when the potentials to be applied to the respective electrodes are made different, the generated plasma can be controlled to be neutron-rich. For example, with a vertical multistage electrode, when a plasma is generated only in the upper portion, the plasma intensity and particle density can be controlled highly accurately.

According to the present invention, CNTs (Carbon Nano-Tubes) can be generated on the respective electrodes that constitute the plasma source, so that the γ electron efficiency of the plasma source may be increased (regarding the details of the CNT forming method, the CNTs can be formed in accordance with thermal CVD or plasma CVD by increasing the temperature of the electrode materials).

Figure 8:
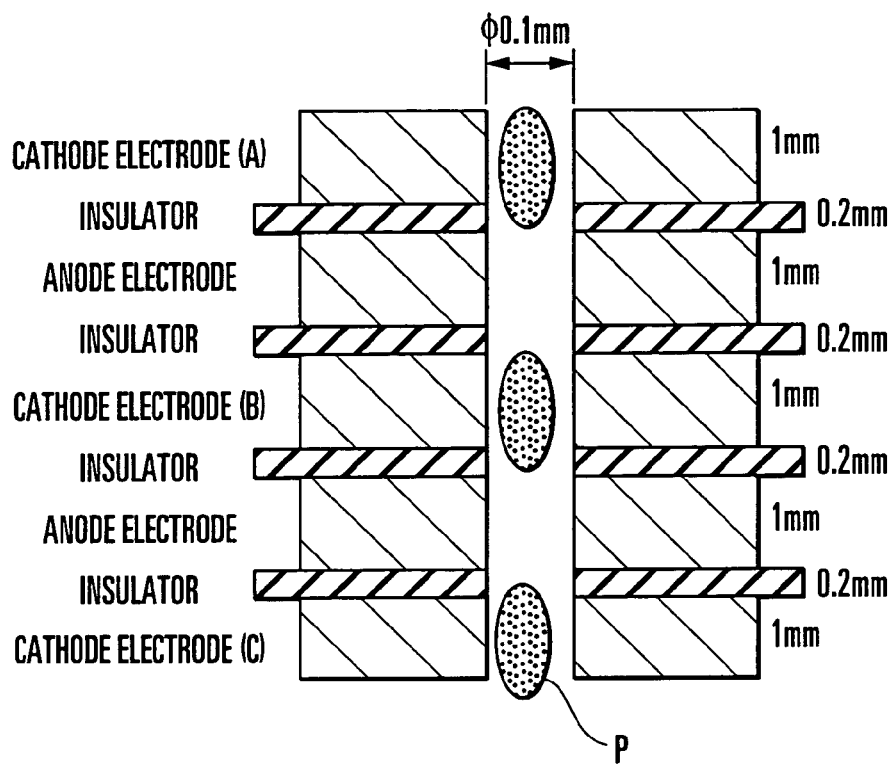
FIG. 8 is a schematic sectional view showing another arrangement example of the plasma source according to the present invention.
Figure 9:
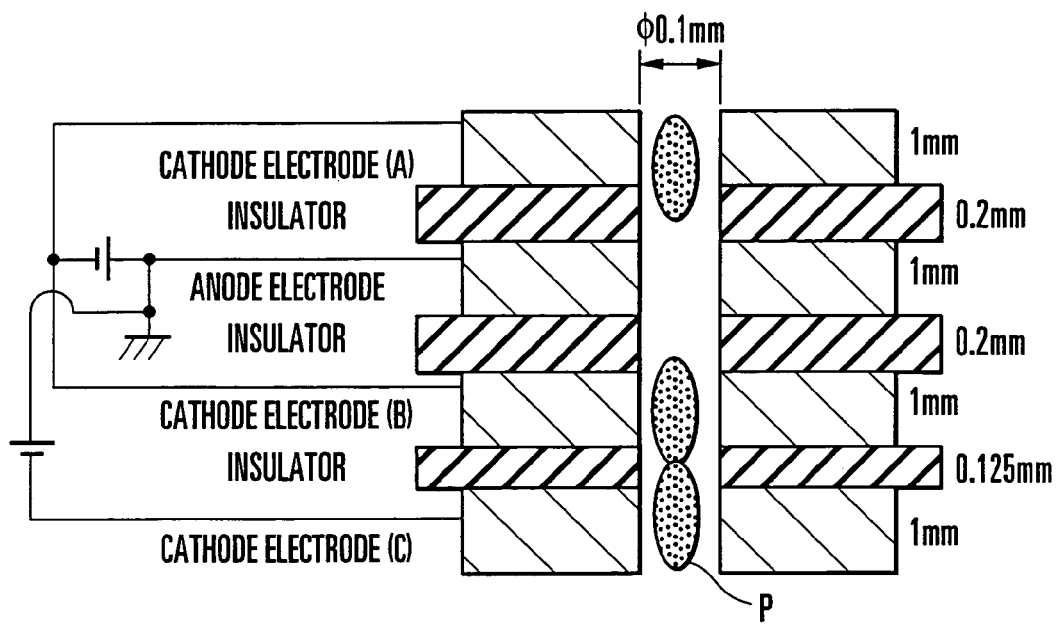
FIG. 9 is a schematic sectional view showing still another arrangement example of the plasma source according to the present invention.

An example of another arrangement of the plasma source according to the present invention is shown in the schematic sectional view of FIG. 8 (an example in which the plasma source has a four-stage arrangement) and that of FIG. 9 (an example in which the plasma source has a three-stage arrangement).

Figure 10A:
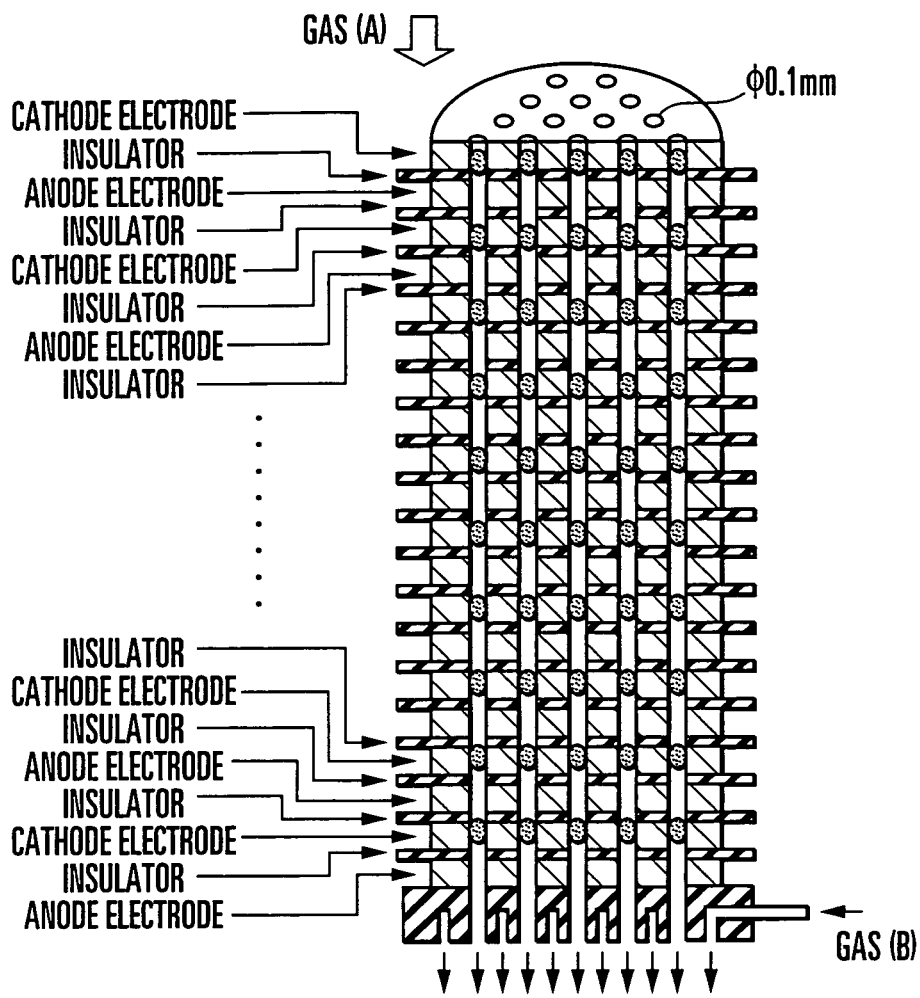
FIG. 10A is a schematic sectional view showing still another arrangement example of the plasma source according to the present invention.
Figure 10B:
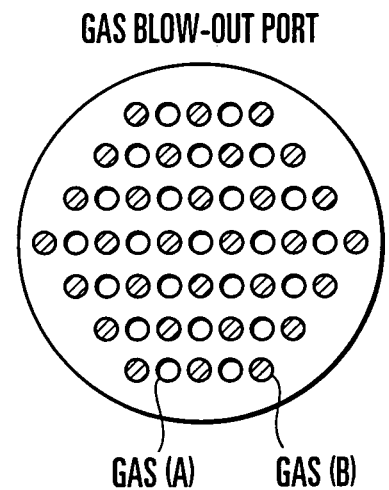
FIG. 10B is a top view of a corresponding gas blow-out port.

As shown in FIG. 10A, the apparatus according to the present invention can form a "three-dimensional multiarray plasma source" or "three-dimensional multiarray particle supply apparatus" in which a plurality of multiarrays are formed on a two-dimensional plane and a plurality of vertical electrodes are arrayed in the vertical direction in one array. FIG. 10B shows a top view of a corresponding gas blow-out port.

Figure 11:
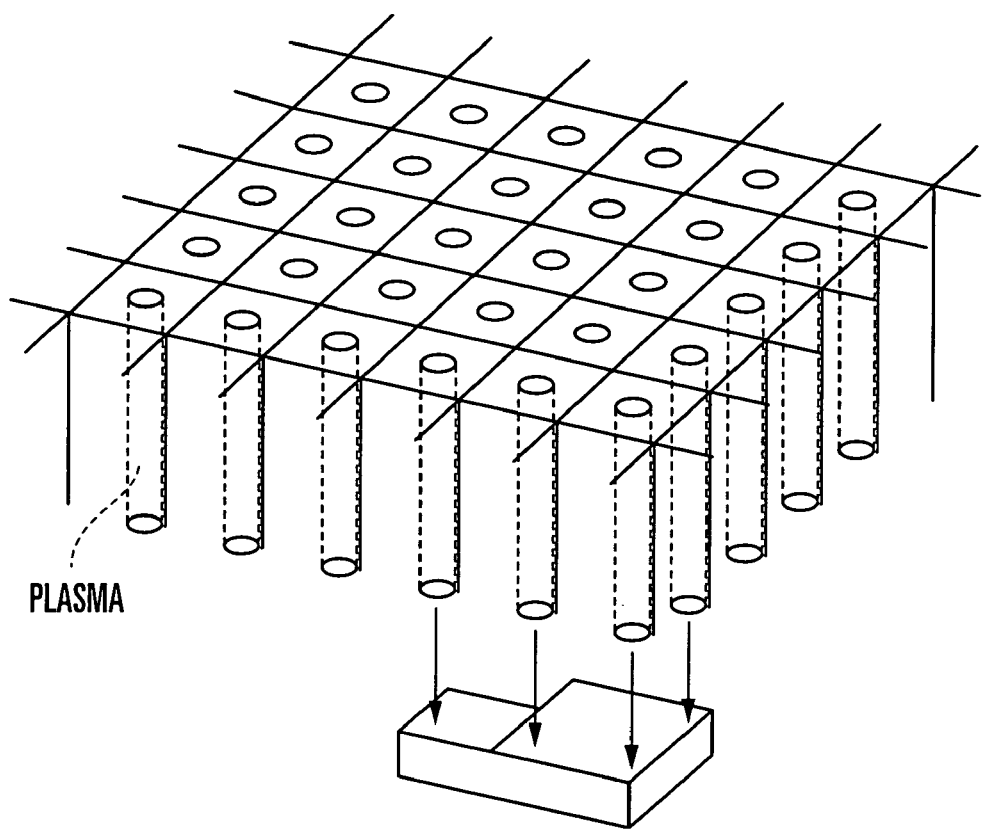
FIG. 11 is a perspective view schematically showing part of the plasma source according to the present invention.
Figure 12:
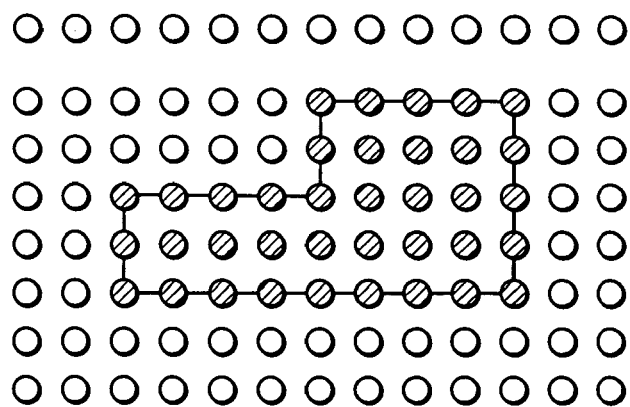
FIG. 12 is a plan view schematically showing part of the plasma source according to the present invention.

Voltages can be applied to the respective pairs of electrodes of the three-dimensional multiarray electrodes independently of each other. In the chamber shown in FIG. 1, a sample 12 having a three-dimensional shape is set on the susceptor. A sample having a two- or three-dimensional shape can be processed by a high-speed radical process in which the plasma, charged particles, radicals, and energy are controlled, in accordance with the sample shape (not only two-dimensionally but also three-dimensionally), as shown in, e.g., FIGS. 11 and 12, by controlling the power supply appropriately by FDD.

Conventionally, a plasma which is larger than at least the shape of the target object is required. Meanwhile, with the apparatus of the present invention, the shape of the plasma can be flexibly changed in accordance with the dimension and size of the target object. In the case of an ordinary plasma process, a shima (sheath) is formed between the plasma and a target object. Three-dimensionally, ions are radiated through the formed shima (sheath). The ion energy cannot be changed in accordance with the shape.

Figure 13:
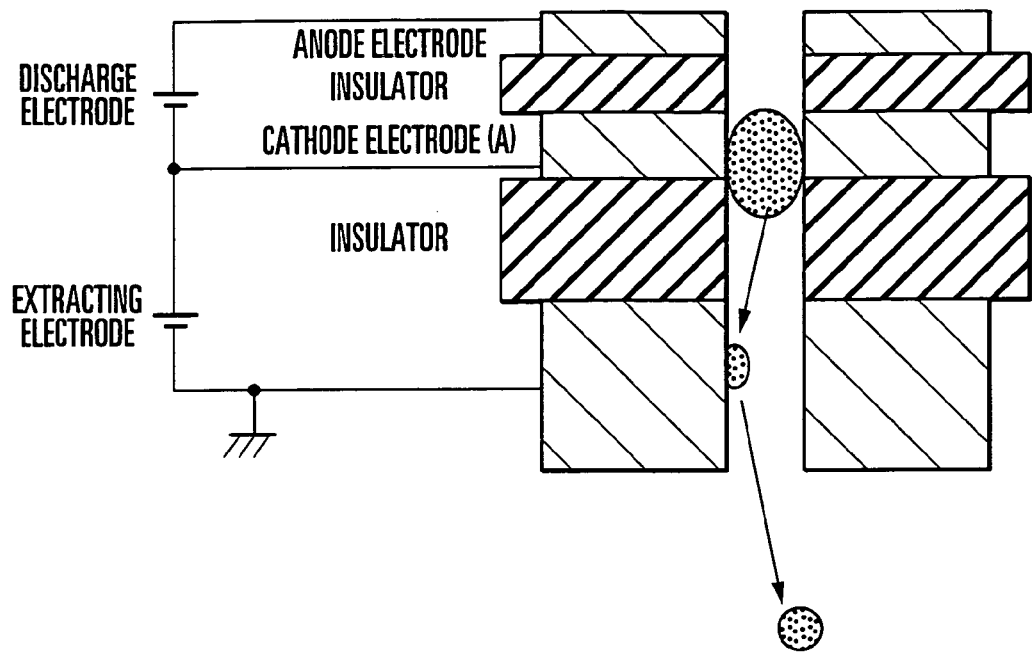
FIG. 13 is a sectional view schematically showing a generation example of high-speed neutral radicals according to the present invention.
Figure 14:
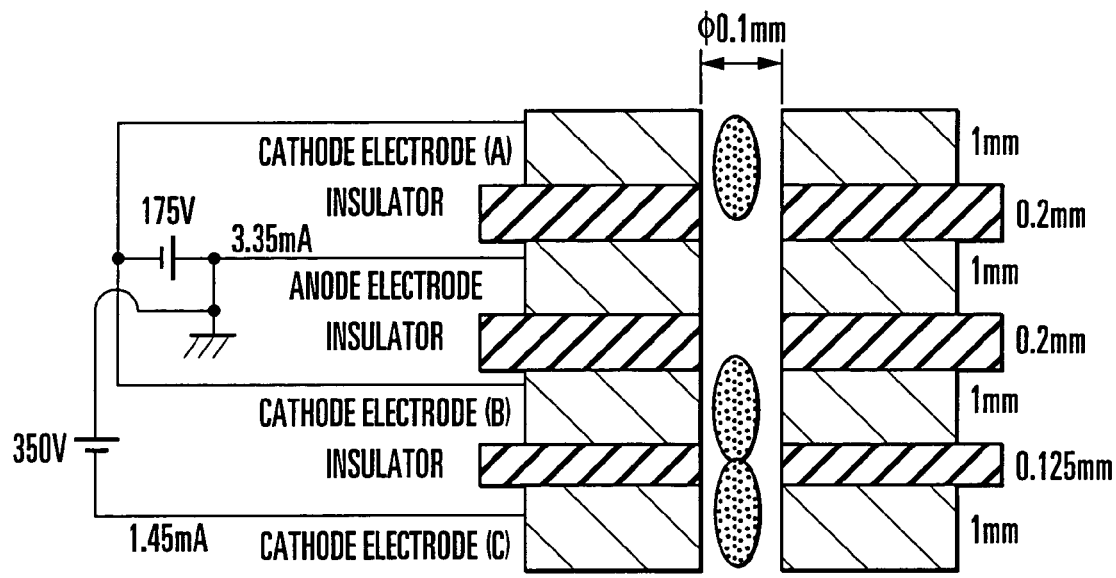
FIG. 14 is a sectional view schematically showing a generation example of high-speed neutral radicals according to the present invention.
Figure 15:
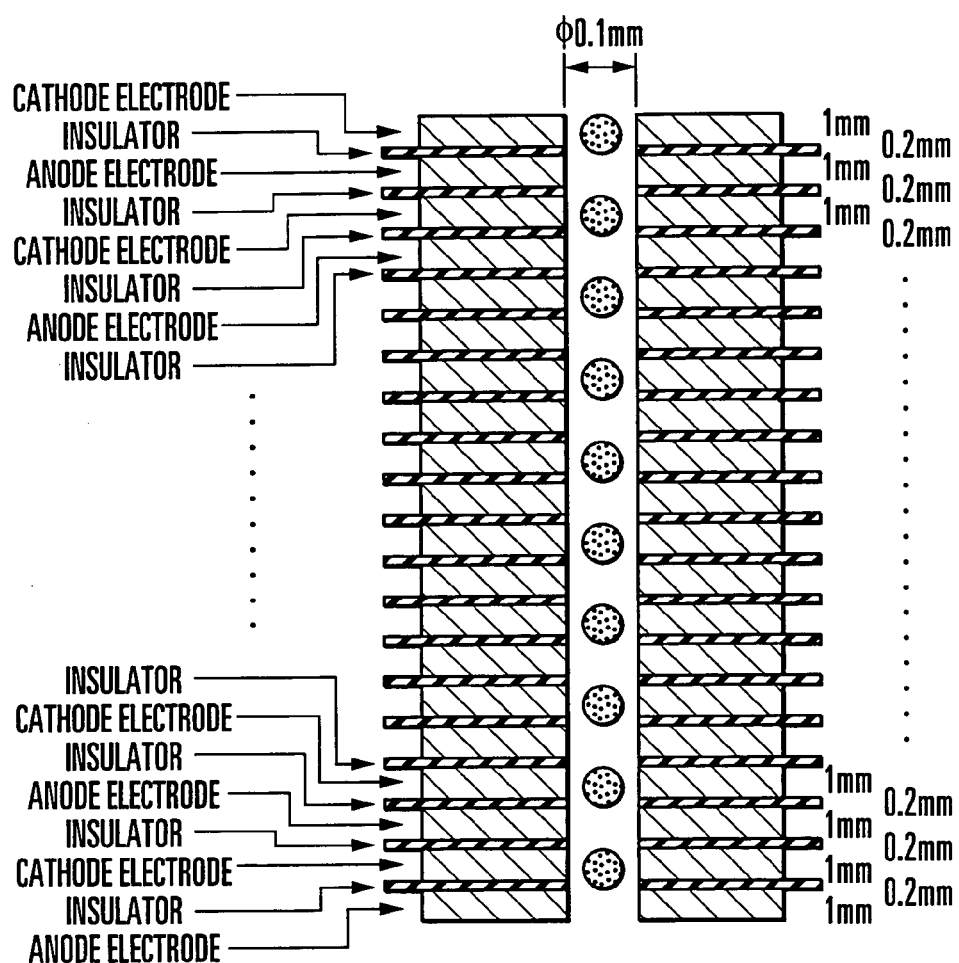
FIG. 15 is a sectional view showing an arrangement example of the plasma source according to the present invention.
Figure 16:
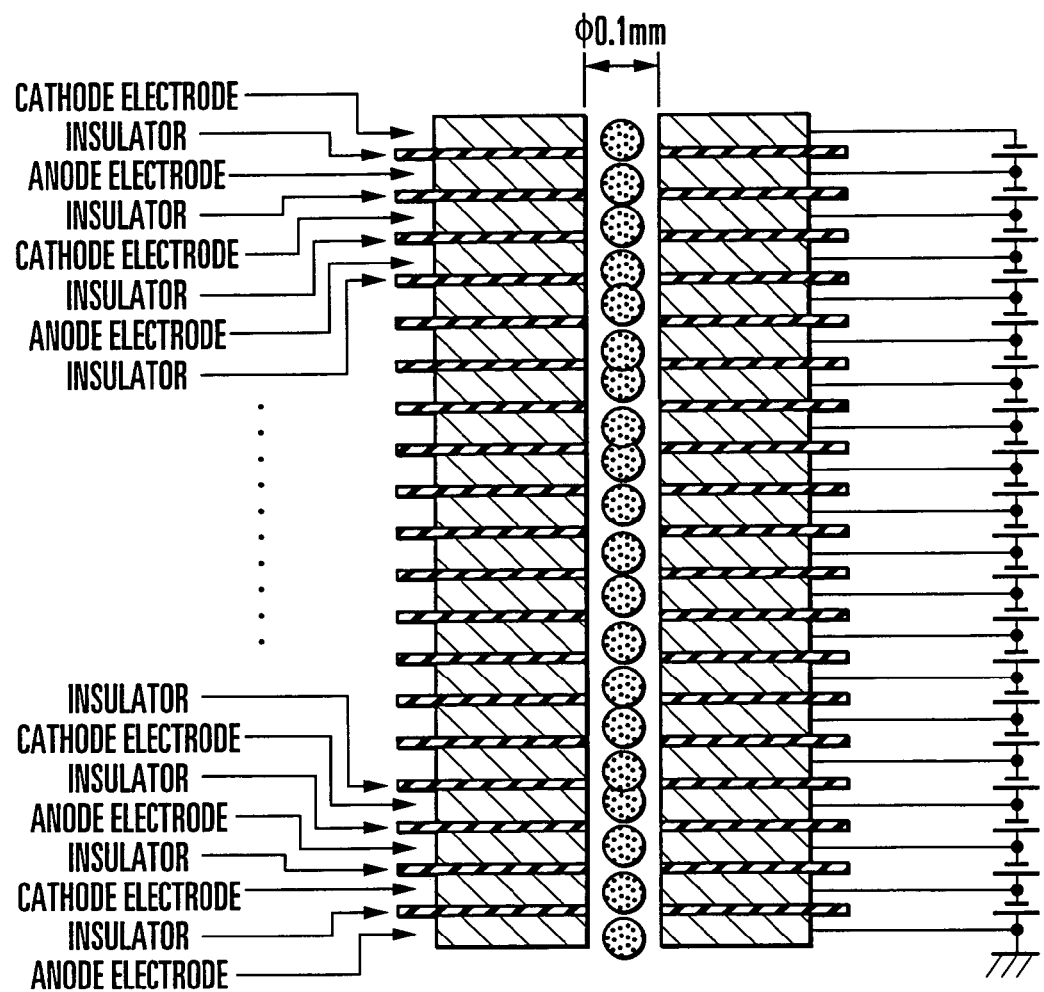
FIG. 16 is a sectional view showing an arrangement example of the plasma source according to the present invention.
Figure 17:
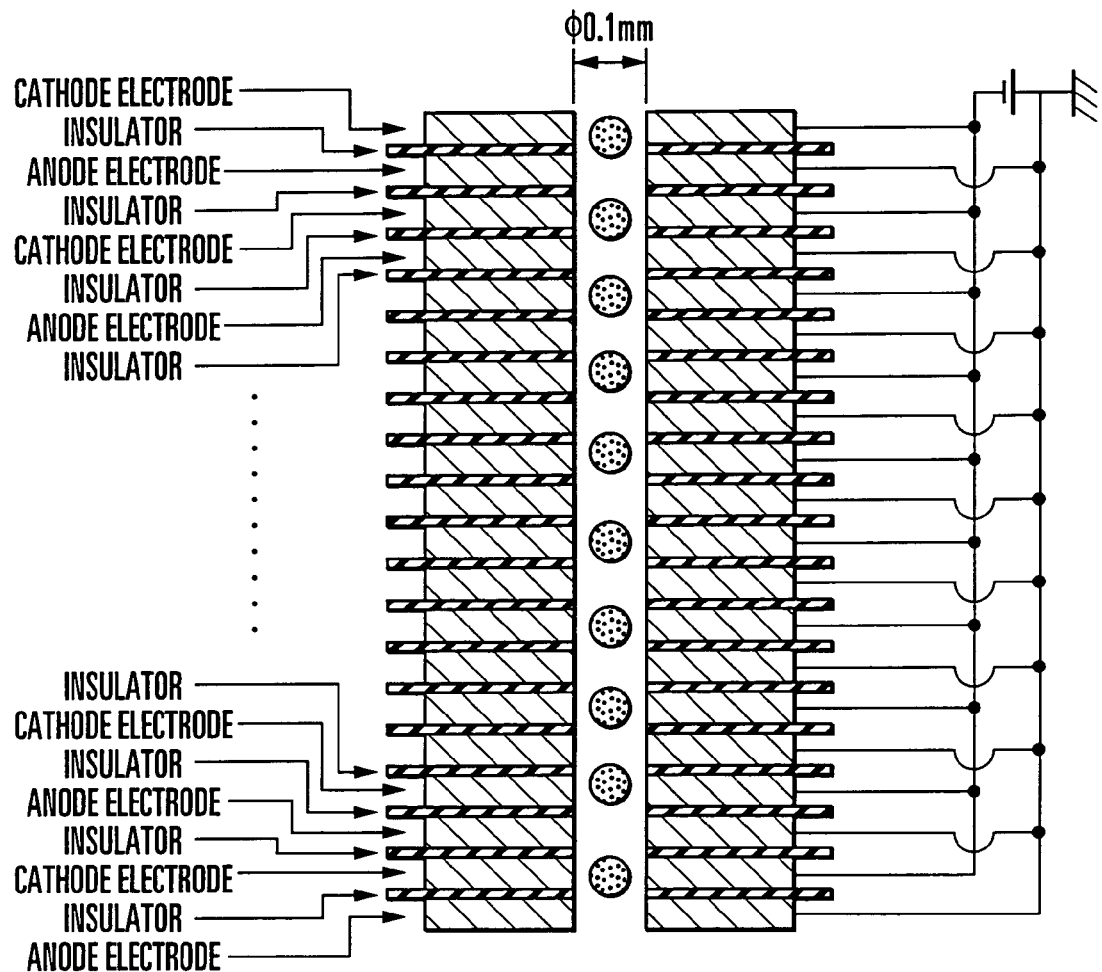
FIG. 17 is a sectional view showing an arrangement example of the plasma source according to the present invention.
Figure 18:
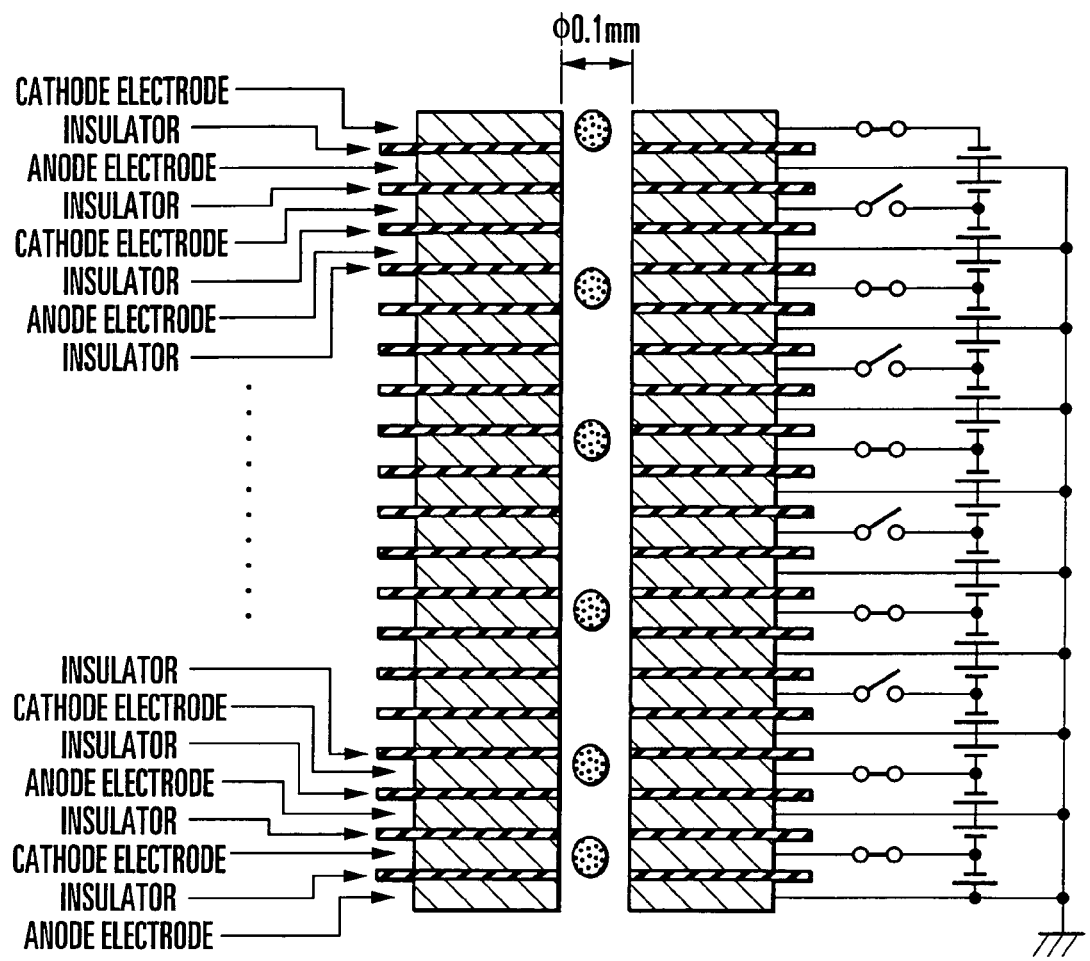
FIG. 18 is a sectional view showing an arrangement example of the plasma source according to the present invention.
Figure 19:
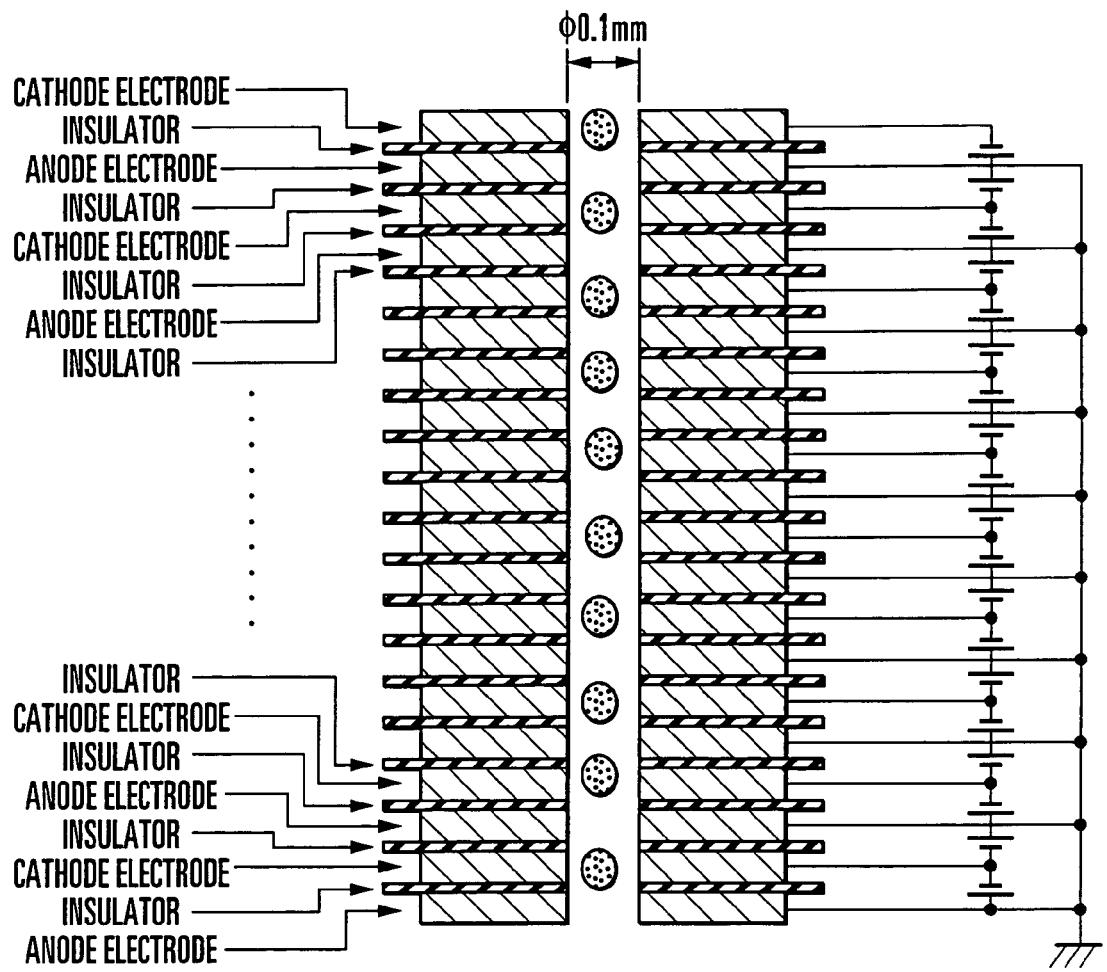
FIG. 19 is a sectional view showing an arrangement example of the plasma source according to the present invention.

With the apparatus of the present invention, for example, the voltage of the extracting electrode shown in FIG. 13, or the voltage between the anode electrode and cathode electrode of a pair of vertical multielectrodes shown in FIG. 14 is controlled, so that radiation of energy-controlled high-speed positive/negative ions or high-speed radicals becomes possible three-dimensionally. Therefore, three-dimensional solid structure having a desired shape can be directly processed or deposited without using a mask pattern or the like.

For example, the respective plasma sources can be on/off-modulated independently on the order of several μ sec to msec. These processes can be controlled on the time axis, so that a four-dimensional plasma process using four-dimensional multiarray electrodes can be performed.

FIGS. 15, 16, 17, 18, and 19 show arrangement examples of a microplasma source that can be used in the present invention.

(Gas Deposition)

According to the experiment conducted by the present inventor, when Kr or Xe gas is introduced, the plasma tends to stabilize. From this viewpoint, He gas is preferable to Ar gas, and Kr or Xe gas is preferable to He gas.

(Electrode Structure)

Figure 20:
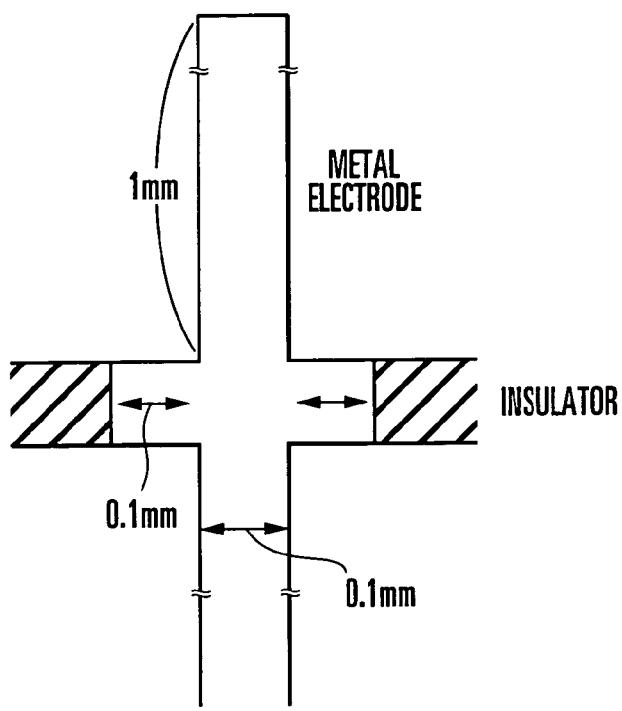
FIG. 20 is a sectional view showing an arrangement example of an electrode that can be suitably used in a plasma source according to the present invention.

As shown in FIG. 20, when the insulator is recessed by 0.1 mm from the conductor electrode, discharge tends to stabilize.

(Kr Emission Intensity)

Figure 21:
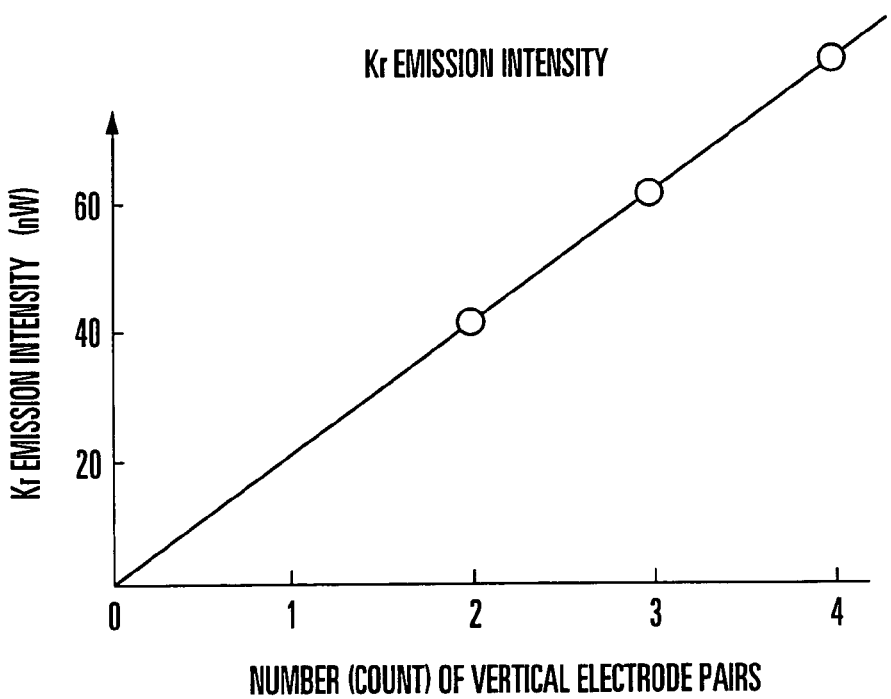
FIG. 21 is a correlation graph showing a relationship between the number of vertical electrode pairs and the Kr emission intensity.

FIG. 21 shows a measurement result of the Kr emission intensity measured by the present inventor.

Plasma diameter: 0.1 mm; Metal Cu: 1 mm;
Insulator $Al_2O_3$: 0.2 mm
Conditions of this experiment:
The Kr gas was flown from the upper portion. A voltage of 175 V was applied at 3.35 mA to the first and second electrode pairs under the atmospheric pressure. As shown in FIG. 21, a plasma was generated by the cathode (A) and cathode (B). The Kr emission intensity (877.7 nm and 760.2 nm) when the plasma was generated was observed by a photodiode to obtain 41 nW. Subsequently, a voltage of 350 V was applied to the cathode electrode (C) of the third electrode pair at 1.45 mA to obtain a photodiode output of 61 nW. In this manner, it was observed that an output from the multistage electrodes increased proportionally to the umber of plasmas.

EXAMPLE 1

An example will be described in which the apparatus of the present invention is applied to pressurization of a gate electrode for the fabrication of a MOS transistor.

A poly-silicon film (thickness: 500 nm) formed on an underlying silicon oxide film (50 nm) is etched using a resist film (100 nm) as a mask. As the multielectrodes, 25 porous electrodes are fabricated each having a diameter of 100 μm and comprising a pair of a metal electrode and insulator.

$He/Cl_2$ gas or $Xe/Cl_2$ is introduced under the atmospheric pressure from the upper portion and is evacuated through the porous electrodes to maintain a reaction point pressure at 1 Torr. The sample described above is set 2.5 mm below the electrodes and is etched.

As the multielectrodes, five pairs of electrodes are set with respect to the lower extracting electrode, and a voltage was applied to the electrodes. A plasma is generated in the vicinity of the five pairs of cathode electrodes. As the ion species in the plasma, $He^+$, or $Xe^+$, $Cl^+$, and $Cl_2^+$ are present. The ions are accelerated toward the lower extracting electrode and neutralized by the lower electrode. The lower electrode radiates high-speed He, or Xe, Cl, and $Cl_2$ particles toward the sample.

The speed of the high-speed particles depends on the voltage applied to the electrode and the structure of the lower electrode, and can be controlled within the range of about 5 eV to 15 eV.

When etching was performed by radiating the neutral radicals, an etching selectivity of 100 or more with respect to the $SiO_2$ resist was obtained at an etching rate of about 500 nm/min. Damage-free processing free from charge-up by charged particles can be performed. When the experimental conditions are optimized appropriately, microprocessing of poly-silicon with a vertical width of about 10 nm can be performed.

When the distance between the plasma generation and lower electrode is increased, the pressure is increased, or the plasma is pulse-changed, a large amount of Cl— ions may be generated, and the sample may be irradiated with Cl— from the extracting electrode. Alternatively, the extracting electrode may be irradiated with Cl— to generate Cl neutral radicals.

EXAMPLE 2

The arrangement of this apparatus is basically the same as that of Example 1. As the gas (A), $H_2/Xe$ gas is introduced under the atmospheric pressure from above the multielectrodes.

Evacuation is performed through the multielectrodes to maintain the pressure in the lower reaction chamber at about 10 Torr. $SiH_4/H_2$ or $SiH_4/Xe$ gas is introduced from the lower electrode to deposit a crystallite silicon thin film on the glass substrate. The substrate temperature is set to 300° C. The glass substrate is used as the sample the distance between the multielectrodes and the sample is about 10 mm.

In the multielectrodes, a large amount of H radicals are generated by the reaction of $H_2+e \rightarrow H+H$, $Xe+e \rightarrow Xe^++e+e$ and introduced into the reaction chamber. The substrate is irradiated with high-speed H radicals with an energy of about 5 eV or less in the same manner as in Example 1.

A large amount of $SiH_3$ radicals are generated by the reaction of $H+SiH_4 \rightarrow SiH_3+H_2$ to serve as a thin-film precursor.

The interaction of the high-speed H radicals and $SiH_3$ radicals forms a high-quality micro-crystallite silicon thin film on the glass substrate. With this method, both the R radical density and the $SiH_3$ density become high, and the two types of radicals can be controlled independently of each other. Consequently, a defect-free micro-crystallite silicon or amorphous silicon film can be formed.

Figure 22:
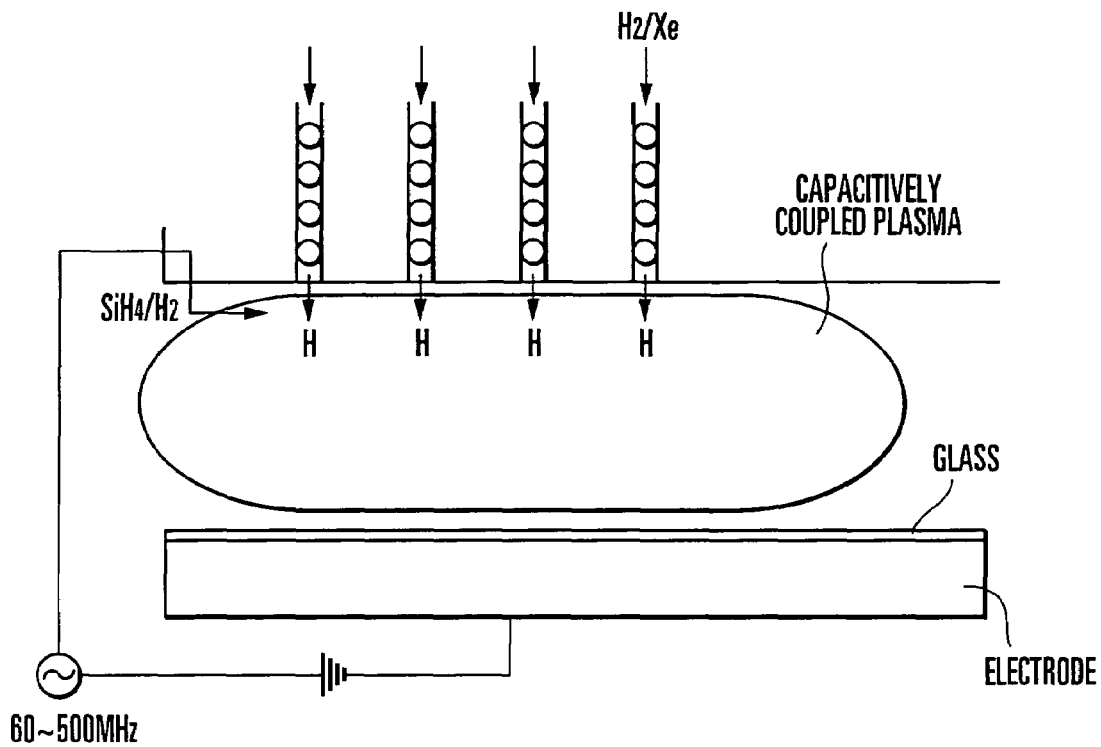
FIG. 22 is a schematic sectional view showing an example of the combination of a plasma source according to the present invention and parallel-plate plasma electrodes.

Furthermore, as shown in FIG. 22, when high-frequency power of 100 MHz is applied between the lowermost electrode of the multielectrodes and the substrate electrode 2, a capacitively coupled $SiH_4/H_2$ plasma excited at 100 MHz can be applied, and high-density H radicals can be inserted in the plasma. When UHF-band high-frequency power of 400 MHz to 500 MHz is used at this time, the same result can be obtained. The distance between the lowermost electrode and the substrate electrode must be changeable in accordance with the operation pressure. A pressure of about 10 Torr (about 1 Torr to 20 Torr) is desirable, but a pressure of 1 Torr to 300 Torr will do.

EXAMPLE 3

Figure 23:
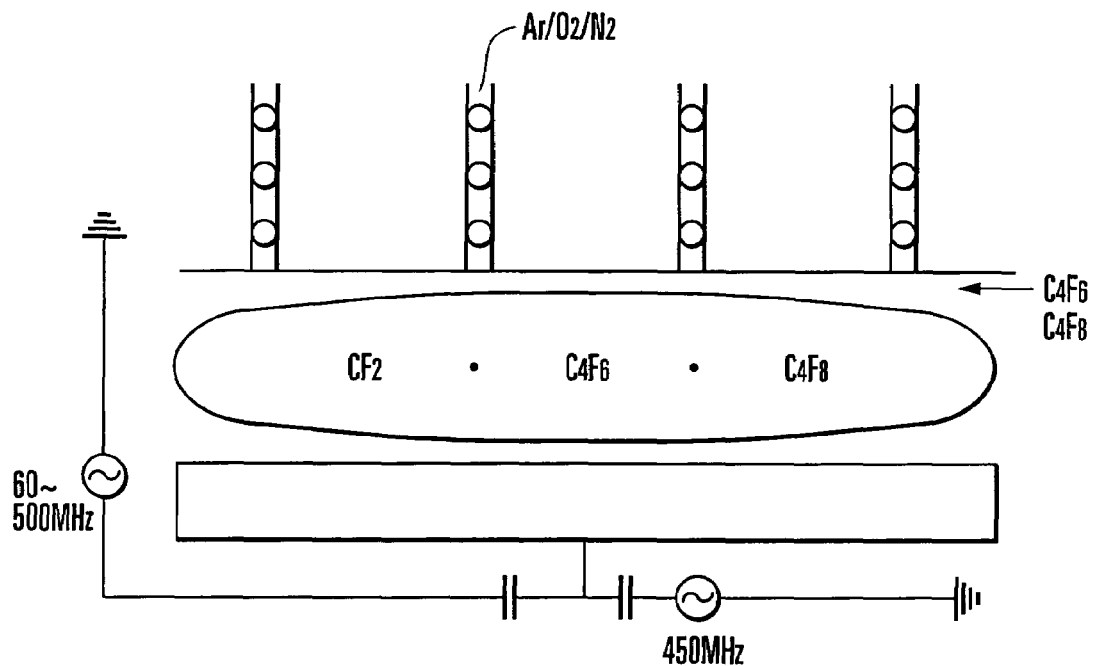
FIG. 23 is a schematic sectional view showing a plasma processing apparatus used in an example.

The arrangement of this apparatus is basically the same as that of Example 2. High-frequency power of 400 MHz and that of 450 KHz are applied to the substrate electrode 2 (FIG. 23). As the gas (A), a gas such as Ar, $O_2$, or $N_2$ is introduced from the above the multielectrodes at the atmospheric pressure. $C_4F_6$, $C_4F_8$, or the like is introduced from the lower electrode to form on the Si substrate. $SiO_2$, SiOCH, organic film SIC, SiCN, or the like is processed using a patterned resist or the like as a mask.

$Ar^+$, $O^+$, or $N^+$ electrons, or O or N radicals are generated in the multielectrodes to inject various types of energy-controlled particles into the reaction chamber.

In the reaction chamber, a plasma has been generated by the 400-MHz high-frequency with the gas such as $C_4F_8$ or $C_4F_6$. Ions in the plasma are introduced into the substrate by the 450-KHz high frequency. Whether the 450-KHz high frequency is to be applied or not may be decided appropriately in accordance with the process.

The plasma of the gas such $C_4F_8$ or $C_4F_6$ mainly generates $CF_2$ radicals.

When high-speed (high-energy) electrons are injected into the plasma through the multielectrodes, the electrons in the plasma form a double distribution comprising a low energy and high energy.

The injected high-speed electrons can promote ionization to greatly increase the $CF_3^+$ density in the plasma. At this time, $CF_2$ radicals are formed of $C_4F_8$ and $C_4F_6$ mainly by low-energy electrons.

Accordingly, the film such as an $SiO_2$ or SiOCH film can be processed highly accurately using the $CF_2$ radicals and $CF_3^+$ ions as major active species. Alternatively, $O_2$ or $N_2$ may be introduced to inject $O^+$, $N^+$, and O, and high-speed O and N radicals into the $C_4F_8$ or $C_4F_6$ plasma so as to process the $SiO_2$ or SiOCH organic film. When the conditions are appropriately selected as well as the material process, high-rate etching can be realized with a vertical shape. While 400 MHz is used in this research, the frequency can be appropriately selected in the range of about 60 MHz to 500 MHz.

In the semiconductor device, conventionally, the design rule is finely determined to promote a high integration density and/or high performance. When the design rule becomes very fine (e.g., about 0.18 μm or less), an increase in wiring resistance and in wiring-to-wiring capacitance becomes conspicuous. With the conventional wiring material, to improve the performance of the device any further is difficult.

For example, to increase the operation speed of the semiconductor device, the speed of the electrical signal must be increased. With the conventional aluminum wiring, however, if the feature size of the semiconductor device shrinks more (for example, to about 0.18 μm or less), a limit is posed to the speed of the electrical signal flowing through a circuit that forms the semiconductor device (a so-called "wiring delay" occurs). Therefore, a wire made of a material, e.g., copper (Cu), which has lower electrical resistance than that of aluminum must be used. As Cu has lower electrical resistance than aluminum, the wiring delay decreases, and electricity flows smoothly even when the wiring is thin.

When a material such as copper having low electrical resistance as described above is to be used, as an insulating film, an "insulating film from which" electricity is less likely to "leak" must be used. This is because when such a Cu wiring through which electricity flows easily and an insulating film from which electricity will not leak easily are combined, a semiconductor device that operates at a very high speed can be fabricated.

In the times when a conventional aluminum wiring was used, an $SiO_2$ film (relative dielectric constant=4.1) was used as an insulating film. When a Cu wiring is to be used, an insulating film having a relative dielectric constant (Low-k) much lower than that of the $SiO_2$ film is necessary. In general, a Low-k film signifies a film having a relative dielectric constant of 3.0 or less.

To fabricate a Low-k film, two methods are conventionally known. One method uses a CVD apparatus. With this method, although a high-quality Low-k film can be obtained, the productivity of Low-k film fabrication is naturally low and accordingly the running cost is high. According to the other method, a Low-k material such as a liquid having fluidization is applied the base material or the like using a spin coater or the like (a method of forming a so-called SOD (Spin On Dielectric) insulating film). With the coating method, an excellent running cost and productivity can be obtained.

Regarding a coating film obtained by the spin coating method described above, in order to obtain desired characteristics, various types of attempts have been conventionally made vigorously in which adjustment of the constituent components of the solution to be applied for coating, the molecular structure of the material, annealing after coating, and the like are appropriately combined to control the chemical structure of the coating film to be obtained.

Depending on the conventional attempts described above, however, desired good characteristics (e.g., good durability which is required when the resist is to be ashed after etching) cannot always be obtained easily. For example, it is pointed out that a Low-k insulating film formed of SOD has a low mechanical strength and, particularly, an organic insulating film tends to lack in ashing resistance.

In contrast to this, with the apparatus according to the present invention, the drawbacks of the prior art described above are solved, and a coating film having high film quality can be formed as will be described hereinafter.

Other embodiments of the present invention will be described hereinafter. In the following description, the present invention will be described in more detail with reference to the drawings when necessary. In the following description, note that "part" and "%" which indicate an amount and ratio are based on the mass standard, unless otherwise specified.

(One Embodiment of Plasma Source)

One embodiment of a plasma source according to this mode will be described with reference to the schematic sectional view of FIG. 24. For the sake of comparison, FIG. 25 shows a schematic sectional view of a conventional spin coating apparatus (which performs only spin coating in a process chamber).

FIG. 24 is a schematic sectional view showing one embodiment of a coating apparatus which is configured to incorporate a plasma source according to the present invention. The plasma source shown in FIG. 24 incorporates a chamber 102 to which a gas should be supplied and a hollow cathode electrode member 104 which is arranged on the gas flow-out side of the chamber 102 and has a plurality of electrode holes 103 through which the gas can flow. The hollow cathode electrode member 104 comprises pairs of porous conductor members 104b which are combined through dielectric porous spacers 104a.

As shown in FIG. 24, a DC power supply (not shown) is connected to be able to apply a voltage between each pair of porous conductor members 104b. A DC power supply 107 is also connected to be able to apply a voltage between each porous conductor member 104b and the chamber 102. Thus, the voltage is applied between each pair of porous conductor members 104b, while flowing a gas through the electrode holes 103, to start DC-driven microcathode discharge, thereby generating a plasma. The region where the plasma is generated is similar to that described with reference to FIG. 3.

When the plasma is generated, electrons collide against the inner walls of the electrode holes 103 to emit electrons (secondary electrons) from the inner walls of the electrode holes 103 by a γ (gamma) function. In the apparatus shown in FIG. 24, the electrons are emitted by the γ function, and the emitted electrons collide against next molecules to ionize the molecules. This a (alpha) function maintains discharge.

When necessary, the hollow cathode electrode member 104 described above may have the plurality of pairs of porous conductor members 104b combined through the porous spacers 104a. This is the same as in the arrangement shown in FIG. 4. This embodiment of having the plurality of pairs of porous conductor members 104b is preferable because the pressure drop is increased and attenuation of the plasma density can be prevented. In this case, the plasma can be stably generated, which is another advantage.

(Coating Apparatus)

The coating apparatus shown in FIG. 24 incorporates at least a process chamber 110, a rotatable base material holding means 111 for arranging an electronic device base material 112 at a predetermined position in the process chamber 110, and a plasma source having the arrangement described above to irradiate the electronic device base material 112 with a plasma.

In the coating apparatus shown in FIG. 24, the target object (e.g., a wafer) on the susceptor 111 which is arranged in the plasma process chamber 110 loaded with the plasma source can be processed by plasma generation based on microcathode discharge in the electrode holes 103. The susceptor 111 is rotatable. A bias power supply (not shown) is connected to the susceptor 111 to be able to apply a predetermined voltage (e.g., an RF voltage or DC voltage) to the susceptor 111. As the susceptor 111 is rotated by this arrangement, a bias can be applied to the susceptor 111. The temperature of the susceptor can be changed to cool or heat the substrate, thereby depositing a film.

A coating material supply means 120 can supply a predetermined coating material 121 onto a machinery 112. With this arrangement, the coating material is supplied onto the machinery 112, while irradiating the machinery 112 with a plasma, to form a coating layer on the machinery 112.

The plasma source having the arrangement described above according to the present invention can generate a plasma based on good microcathode discharge relatively without being influenced by a gas pressure under which the plasma source is driven. In other words, the plasma source according to the present invention can easily realize an atmospheric-pressure plasma (with a pressure of about 101.3 kPa; densities of electrons, ions, and radicals are generally about $10^{15}/cm^3$) having a prodigiously higher density than that of a so-called low-pressure plasma (with a pressure of about 0.133 Pa to 13.3 Pa; densities of electrons, ions, and radicals are generally about $10^{11}$ to $10^{12}/cm^3$).

When such an atmospheric-pressure plasma is used, stable discharge can be performed under the atmospheric pressure, so that a so-called non-equilibrium plasma having an electron temperature higher than the gas temperature can be suitably realized. In particular, when a plurality of plasmas are generated vertically, plasma stabilization can be achieved.

In contrast to this, in the conventional plasma source or coating apparatus as shown in FIG. 25, as the plasma is generated in the plasma preliminary chamber (not shown), it is generally difficult to decrease the conductance and increase the pressure in the plasma preliminary chamber. Also, the dynamic range of the particle acceleration/deceleration energy is small. When the voltage to be applied to the plasma source is appropriately changed, the high-density atmospheric-pressure plasma can radiate a plasma, electrons, positive/negative ions, and neutral radicals separately. Also, accelerated positive/negative ions may be neutralized by the wall of the plasma source or in the gas phase to radiate high-speed neutral radicals.

(Arrangement of Respective Portions)

The respective portions and the like that constitute the plasma source or coating apparatus according to the present invention will be described in detail.

(Chamber)

Regarding the chamber 102 shown in FIG. 24 to which the gas is to be supplied, as far as a gas for plasma generation can be supplied into the chamber 102 and the plasma source can be arranged on the gas flow-out side, the structure, size, material, and the like of the chamber 102 are not particularly limited.

(Hollow Cathode Electrode Member)

The hollow cathode electrode member 104 has the plurality of electrode holes 103. As far as plasma generation in the electrode holes 103 is possible, the number and size of the electrode holes 103, the thickness of the hollow cathode electrode member 104, and the like are not particularly limited.

(Porous Spacer Member)

As described above, the hollow cathode electrode 104 includes at least one set of a pair of porous conductor members combined through a dielectric porous spacer member. As far as plasma generation in the electrode holes 103 is possible, the material, size, thickness, and the like of the porous spacer 4a are not particularly limited.

(Porous Conductor Member)

As far as plasma generation in the electrode holes 103 is possible, the material, size, thickness, and the like of the porous conductor members 104b are not particularly limited.

(Gas)

The gas that can be used in the present invention and should be supplied into the chamber 102 is not particularly limited, and various types of gases can be used in accordance with the purposes of the plasma process. More specifically, usually, various types of inert gases (e.g., a rare gas such as argon) can be used as a plasma generation gas.

(Plasma Generation Principle)

According to the present invention, as far as plasma generation in the electrode holes 103 is possible, the plasma generation principle is not particularly limited. More specifically, while a DC voltage is applied between the pair of porous conductor members 104b in the apparatus shown in FIG. 24, the DC voltage can be replaced by high-frequency waves or microwaves.

Other Embodiments

Figure 26:
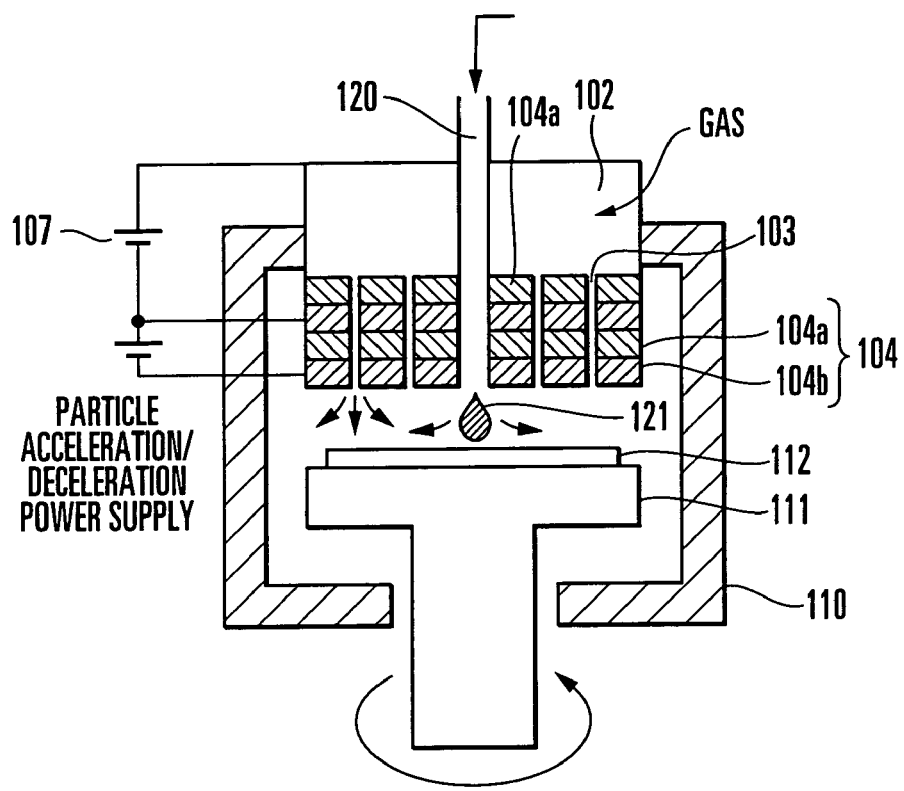
FIG. 26 is a sectional view schematically showing an arrangement example of another coating apparatus which uses a plasma source according to the present invention.
Figure 27:
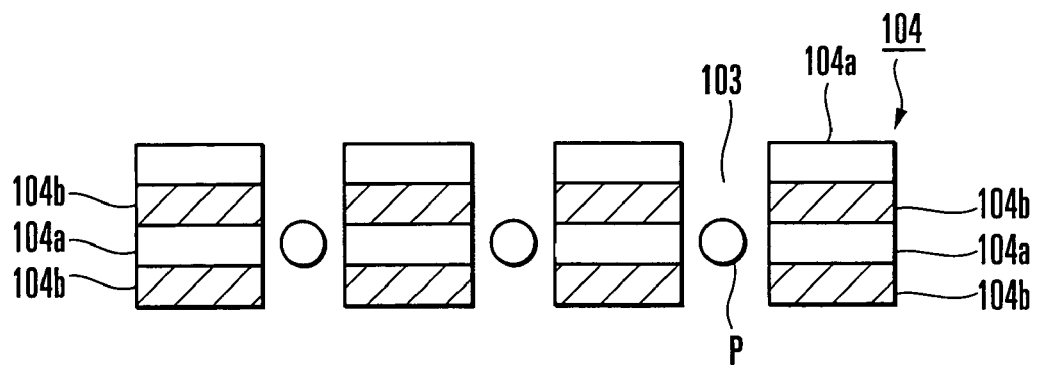
FIG. 27 is a sectional view showing part of the arrangement of a plasma source according to the present invention.

FIGS. 26 and 27 show coating apparatuses according to other embodiments of the present invention. In the embodiments shown in FIGS. 26 and 27, the uppermost portion of a hollow cathode electrode member 104 comprises dielectric porous spacers 104a so that discharge can readily focus on the electrode holes 103.

(Electronic Device Base Material)

When the plasma source or coating apparatus described above is employed, various types of electronic device base materials (e.g., a wafer) can be processed with a plasma. The electronic device base material described above that can be used in the present invention is not particularly limited, and one type or a combination of two or more types of known electronic device base materials can be selectively used. An example of such a electronic device base material includes a semiconductor material, liquid crystal device material, and the like. An example of the semiconductor material includes a material containing single-crystal silicon as a major component, SiC, GaAs, and the like.

In the present invention, other than those described above, any material that contains at least Si, C, and/or a metal or the like and that is liquid in the vicinity of a normal pressure can be used with any particular limitations.

In the present invention, for example, a coating material and the coating process which can be used in the conventional sol-gel method can be employed with any particular limitations.

In the present invention, a material (coating-difficult material) that is difficult to use for coating in the conventional process, a high-k material (e.g., a high-dielectric-constant thin film HfO), and a ferroelectric thin film (e.g., BST, i.e., a thin film containing Bi, Si, and/or Ti) can be used for coating.

(Coating Method)

In the coating method which uses the apparatus shown in FIG. 24 or 26, while irradiating an electronic device base material arranged in the process chamber with a plasma, a coating material is supplied onto the electronic device base material to form a coating layer on the base material. During forming the coating layer (in the coating process), the pressure of the plasma process may be changed. During supply of the coating material, the pressure for the plasma process can be changed over time to change a film structure to be formed on the electronic device base material periodically and/or inclinedly so as to form a coating layer having a multilayer structure and/or inclined structure.

(On Electronic Device Base Material)

In the present invention, a state "on the electronic device base material" is sufficiently established as far as the coating film to be formed is located above the electronic device base material (that is, above that side of the base material where respective layers which constitute the electronic device are formed). In other words, another insulating layer, conductor layer, semiconductor layer, or the like may be arranged between the machinery and coating film. Naturally, a plurality of various types of insulating layers, conductor layers, semiconductor layers, or the like including the coating film to be formed in the present invention may be arranged when necessary.

(Coating Material)

The coating material that can be used in the present invention is not particularly limited, and any organic material and/or inorganic material can be used. The material may be, e.g., a solution. As such an organic material and/or inorganic material, for example, a curable material can be used.

(Curable Material)

The curable material that can be used in the present invention is not particularly limited. From the viewpoint of a suitable combination with a good-conductivity wiring material such as Cu, a curable material that provides an insulating film having a dielectric constant of 3 or less after cure is preferable.

As such a curable material, for example, a low-dielectric-constant organic insulating film having a dielectric constant of 3 or less can be used, and an organic polymer such as PAE-2 (manufactured by Shumacher), HSG-R7 (manufactured by Hitachi Chemical Co., Ltd), FLARE (manufactured by Aplied Signal), BCB (manufactured by Dow Chemical), SILK (manufactured by Dow Chemical), or Speed Film (manufactured by W. L. Gore) can be used.

(How to Arrange Curable Material)

How to arrange the curable material on the electronic device base material is not particularly limited. From the viewpoint of simplification of the apparatus, a solution or dispersion of a fluid curable material is preferably applied to the electronic device base material. This coating is preferably spin coating.

(Example of Suitable Condition)

In the present invention, for example, the following conditions can be suitably used.

Microwaves: 2 kW/cm$^2$; a DC voltage may be supplied to the hollow cathode plasma source. 1 to 10 W/cm$^2$ Gas: Ar, 1,000 sccm+N$_2$, 100 sccm, or Kr, 1,000 sccm+N$_2$, 100 sccm, or H$_2$ or CO$_2$ He: Appropriately

O$_2$:

Pressure: 1 to 760 mTorr (133 to 10×10$^4$ Pa)

Base material temperature: 350±50° C.

Process time: 30 to 120 sec

Other Embodiments

As described above, with the conventional plasma modifying method, a coating having uniform composition is formed and thereafter modified by irradiation with a plasma or the like.

In contrast to this, according to the present invention, when forming a coating layer, the densities of O atoms, N atoms, and the like are changed to control the atomic densities freely. According to the present invention, for example, the gradients and distributions of the atomic densities in the coating layer can be formed easily, and layers having different compositions can be stacked.

For example, in the present invention, when an organic film which has been formed by [Spin on] while performing an N radical process is nitrided at 100° C., CN(sp$^3$) can be formed easily. In the present invention, when an organic film is nitrided at 20° C., CN(sp$^2$) can be formed easily. The etching resistance largely differs between sp$^3$ (difficult to etch) and sp$^2$ (easy to etch). Thus, the sp$^2$ component can be selectively etched by utilizing sp$^3$ and sp$^2$ film formation. With this process, a porous low-dielectric-constant thin film (k≦2.0), the film structure of which comprises the sp$^3$ component, can be formed.

As described above, in formation of a coating film in accordance with the sol-gel method, when the plasma process according to the present invention is performed, a Bi—Ti—O film or the like (BIT) and a —Sr—Bi—Ta—O film or the like (SBT), each of which has a smooth surface and excellent crystal orientation and a leak current from which is small, can be obtained easily.

Figure 28:
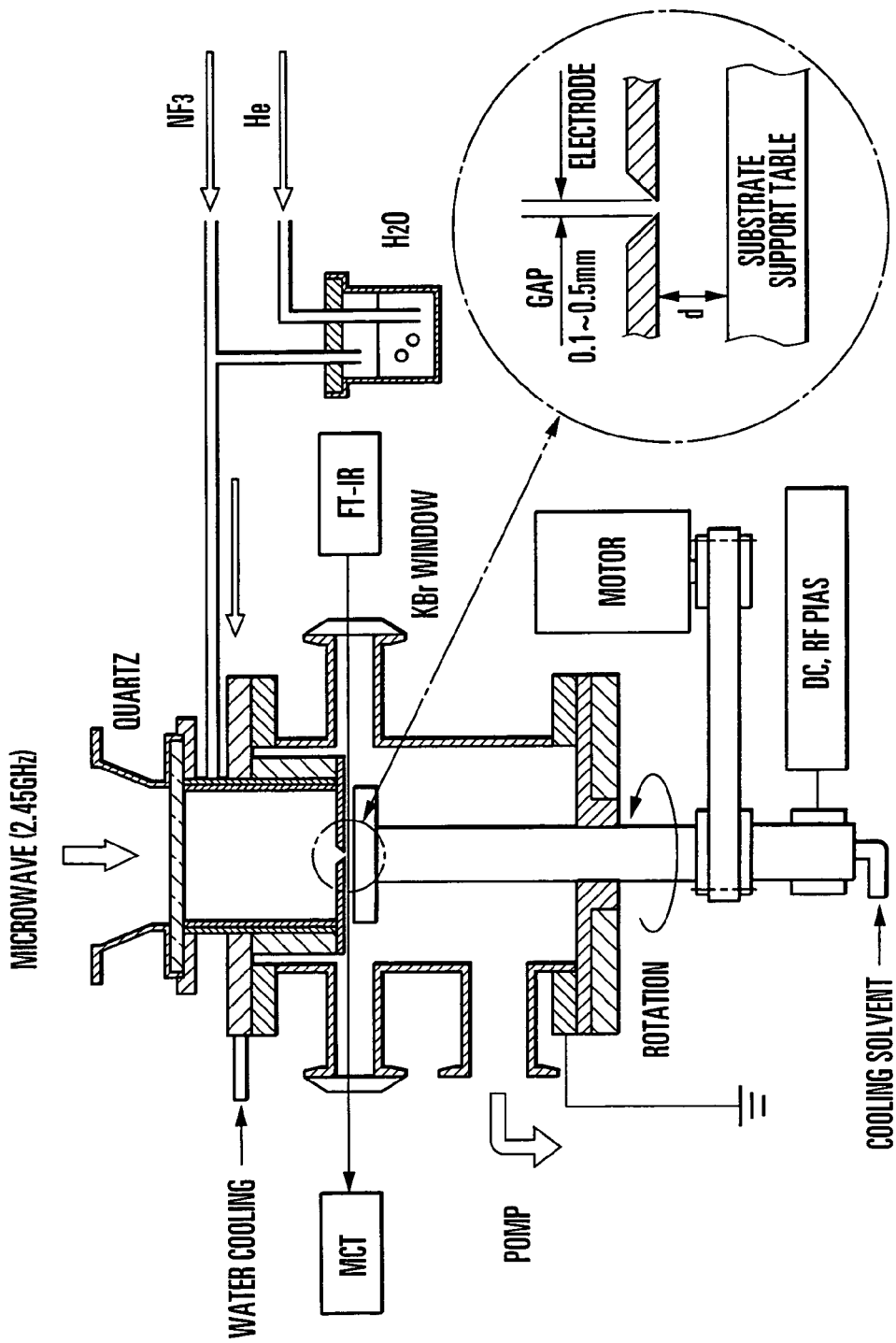
FIG. 28 is a sectional view schematically showing an arrangement example of another coating apparatus which uses a plasma source according to the present invention.

FIG. 28 shows an example of a surface processing apparatus according to still another embodiment of the present invention. In the apparatus shown in FIG. 28, NF$_3$ is used as an etching gas, and H$_2$O is used as a liquid. H$_2$O is obtained by bubbling He gas. How to obtain H$_2$O is not limited to a bubbling means but a vaporizer can be used. Also, H$_2$O may be obtained by direct liquid injection. An oxide film (SiO$_2$) is formed on the base material. The formed oxide film is etched efficiently. When the process is performed by using this apparatus system, a high-quality thin film can be formed and a surface process can be performed.

Figure 29:
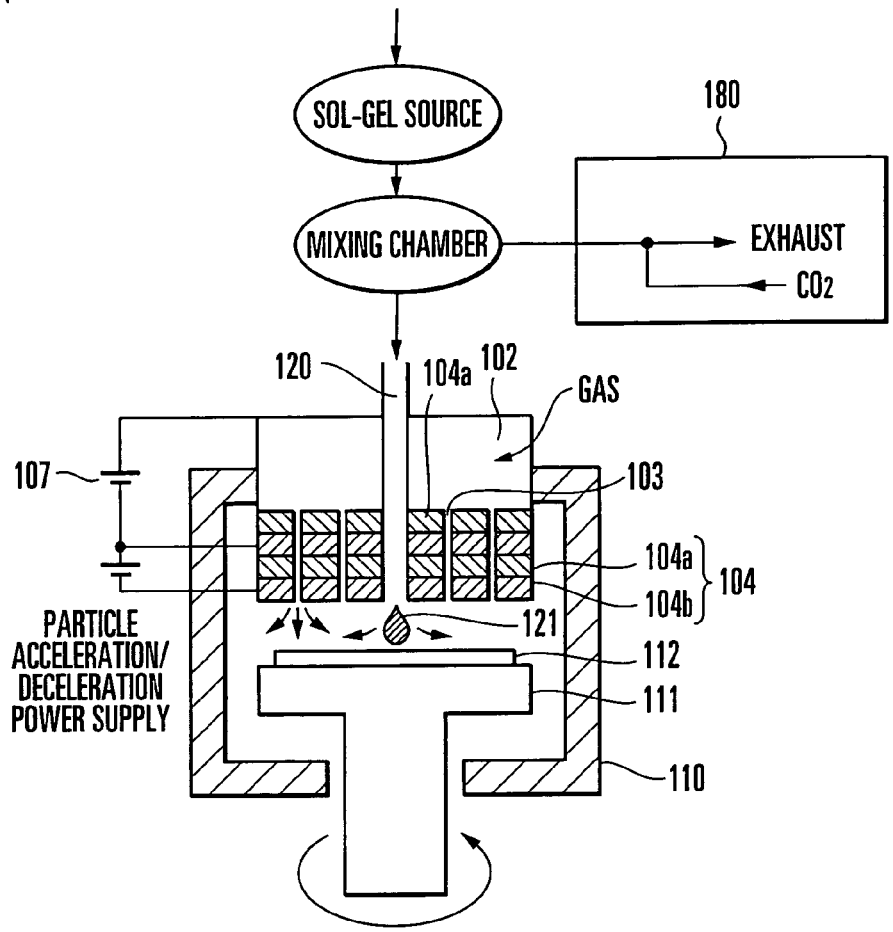
FIG. 29 is a sectional view schematically showing an arrangement example of still another coating apparatus which uses a plasma source according to the present invention.

FIG. 29 shows still another embodiment of the present invention. In this embodiment, the sol-gel method is employed to form Ferraelectic random access meweries (Fe-RAMs).

Generally, in FIG. 29, a sol-gel solution (e.g., an alcohol culture liquid or the like containing 10% weights of BSO, BIT, and SBT) can be introduced to a reaction chamber to coat a Pt electrode (not shown) on a wafer (electronic device base material) 112 with a thin film of $Bi_2SiO_5$ (BSO), $Pb(Zr,Ti)O_3$ (PZT), $SrBi_2Ta_2O_9$ (SBT), and $Bi_4Ti_3O_{12}$ (BIT).

In the above coating, when these solutions are introduced, a plasma of a gas such as $O_2$ or Ar is generated simultaneously to deposit the thin film while irradiating the solutions or wafer with radicals and ions such as $O^-$, $O^+$, or $Ar^+$. As a result, a dense thin film which has a smooth surface and excellent crystal orientation and which is free from oxygen lack can be formed.

Furthermore, in FIG. 29, a supply unit 180 portion can be connected to the apparatus, $CO_2$ which is pressurized (73 atm) at 31° C. can be set in the supercritical state, and a solution mixed with BSO, PZT, SBT, and BTT can be introduced into the supercritical $CO_2$ solution to form a thin film while irradiating the solution with a plasma (regarding the details of such combination of the sol-gel method and supercriticality, for example, e.g., Jpn. J, Appl. Phys. Vol 42 (2003), pp L404-L405 can be referred to).

When an 80-nm thick BSO/BTT or SBT film was annealed at about 700° C. for 30 min, it showed excellent characteristics with a leak current on the order of $10^{-5}$ $A/cm^2$.

This is because the thin film became dense and oxygen lack disappeared when the film was irradiated with O radicals, $O^-$ ions, $O^+$ ions, and $Ar^+$ ions generated by the atmospheric-pressure plasma.

A case will be described hereinafter wherein the plasma source and plasma processing apparatus according to the present invention are applied to formation of carbon nanotubes.

A CNT (Carbon NanoTube) is a high-aspect-ratio hollow cylindrical crystal having, e.g., a diameter of about several nm and a length of about 1 μm.

The physical properties of the CNT have been analyzed considerably in the past several years. Currently, application of the CNT in very wide fields is regarded promising, including the composite material field (e.g., for reinforcement and imparting conductivity) represented by an electronic material, the electronics field (e.g., a transistor, diode, and wiring), an electron source (e.g., a field emission type electron source, various types of displays), nanotechnology (e.g., probing with a scanning probe microscope (SPM), and nanomechatronics elements), the energy field (e.g., hydrogen occlusion, an electrode or capacitor material), the chemical field in general (e.g., a gas sensor, catalyst, and organic raw material). Application of the CNT in some of the above fields is already on the stage of practical use.

As a CNT manufacturing method, conventionally, the carbon arc discharge method, the carbon laser vaporization method, the hydrocarbon gas thermal decomposition method, the plasma CVD (Chemical Vapor Deposition) method, and the like which use acetylene gas or the like as the carbon source are known. Above all, the plasma CVD method is advantageous in terms of selective generation (Gekkan FPD Intelligence 1999. 11 P38-P40 "Nippon Shinku develops CVD device for forming FED carbon nanotube which vertically deposits carbon nanotube selectively").

In CNT formation with the conventional plasma CVD method, the condition range for forming a good CNT is rather narrow. Accordingly, depending on the characteristics or the like of the plasma to be used, frequently, a CNT having a good structure cannot be obtained.

In contrast to this, with the plasma source and plasma processing apparatus according to the present invention, a CNT having a good film quality can be obtained.

(CNT Formation Process)

According to the present invention, as the CNT formation process, the following three types can be employed.

(1) Plasma process; (2) Radical Process; and (3) Radical-emphasized plasma process: of the above processes, when the "plasma process" is employed, a sheath is formed in the plasma between the substrate surface and the plasma, and a CNT tends to grow toward an electrical field generated in the sheath. Accordingly, a CNT is generated even where it is not necessary. Sometimes a post-process is required to remove such an unwanted CNT.

When the radical process is employed, while applying an electrical field between predetermined electrodes (metals), a substrate is selectively irradiated with radical molecules or atoms by changing the type and energy. A CNT can be selectively grown by these reactions.

When the radical process or radical-emphasized plasma process described above is to be employed, in order to selectively irradiate the substrate with the radicals, a porous hollow cathode discharge type plasma source described with reference to FIGS. 1 to 4 can be used. Also, the "extracting electrode" is removed. Thus, the plasma source can be used as a radical radiation source.

When the apparatus shown in FIGS. 1 to 4 is used for CNT formation, a heater or the like is set in the base material holding means 11 so that the target object placed on the base material holding means 11 can be heated to about ~600° C.

(Gas)

Figure 30:
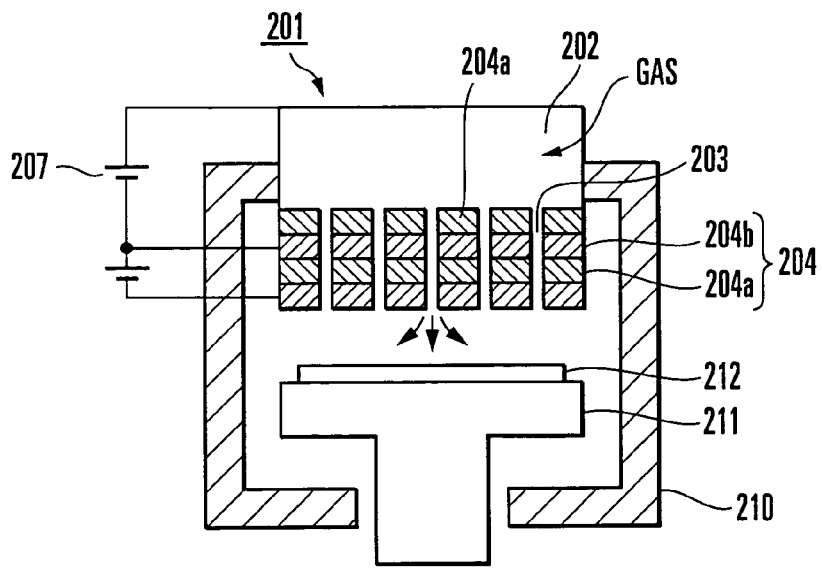
FIG. 30 is a sectional view schematically showing an arrangement example of a CNT forming device which uses a plasma source according to the present invention.

The gas to be supplied into the chamber 2 is not particularly limited as far as it can form an CNT, and various types of gases can be used in accordance with the use of the CNT to be formed. More specifically, usually, various types of inert gases (e.g., a rare gas) can be used as a plasma formation gas, and various types of carbon-containing gases (e.g., acetylene) can be used as a CNT formation gas. Other gases may be added when necessary. The gas that can be suitably used in the present invention will be described hereinafter.
Plasma generation gas: inert gas
Carbon-containing gas: CH-based gas A CNT may also be formed by using the plasma processing apparatus shown in FIG. 30. In the plasma processing apparatus shown in FIG. 30, a plasma source 201 includes a chamber 202 to which a gas should be supplied and a hollow cathode electrode member 204 which is arranged on the gas flow-out side of the chamber 202 and has a plurality of electrode holes 203 through which the gas can flow. The hollow cathode electrode member 204 comprises pairs of porous conductor members 204b which are combined through dielectric porous spacers 204a. A DC power supply 207 is connected to be able to apply a voltage between each porous conductor member 204b and the chamber 202. The plasma processing apparatus includes a process chamber 210 and a base material holding means 211 for arranging an electronic device base material 212 at a predetermined position in the process chamber 210. In order that discharge readily focuses on electrode holes 203, dielectric porous spacers 204a are arranged on the uppermost portion of a hollow cathode electrode member 204 as well. This also applies to the arrangement shown in FIGS. 26 and 27.

(Plasma Generation Principle)

In CNT formation using the plasma processing apparatus described above, the plasma generation principle is not particularly limited as far as plasma generation in the electrode holes 3 is possible. More specifically, in the embodiment shown in FIG. 1 described above, a DC voltage is applied between each pair of porous conductor members 4b. The DC voltage can be replaced by a high frequency or microwaves.

(Base Material)

In CNT formation using the plasma processing apparatus described above, various types of base materials (e.g., an electronic device base material such as a wafer) can be processed with a plasma. The base material is not particularly limited, and one type or a combination of two or more types of known base materials can be appropriately selectively used. An example of such a base material includes a semiconductor material and liquid crystal device material. An example of the semiconductor material includes a material containing single-crystal silicon as a major component, e.g., SiC or GaAs.

(CNT Formation Method)

In the CNT formation method according to the present invention, while irradiating a base material arranged in a process chamber with a plasma, a CNT formation material is supplied onto the base material to form a CNT layer on the base material.

(On Base Material)

In the present invention, a state "on the base material" is sufficiently established as far as the CNT to be formed is located above the base material (that is, above that side of the base material where respective layers which constitute the electronic device are formed). In other words, another insulating layer, conductor layer, semiconductor layer, or the like may be arranged between the machinery and the CNT to be formed. Naturally, a plurality of various types of insulating layers, conductor layers, semiconductor layers, or the like including the CNT to be formed in the present invention may be arranged when necessary.

(Thickness)

The thickness of the CNT layer to be formed in the present invention is not particularly limited, but about several 1 nm (in the case of channel formation) to 2 (in the case of a wiring) is preferable.

As described above, according to the present invention, a CNT can be easily formed between metals (e.g., electrodes). The metals that can be used are preferably transition metals from the viewpoint of the catalyst function. Alternatively, an electrode obtained by dispersing a transition metal (Ni, Co, Pd, or the like) powder on the metal surface, or an electrode formed by selective position control is desirable.

According to the present invention, in addition to the method described above, a carbon nanocoil can be formed by using a NiFe catalyst (for details of formation of such a carbon nanocoil or CNT formation, for example, Diamond and Related Materials, 9 (2000), 847-851; Dengakuron A, volume 118, No. 12 (year of Heisei 10) pp. 1425-1428 can be referred to).

(Example of Suitable Condition)

In the present invention, for example, the following conditions can be suitably used.

Microwaves: 2 kW/cm$^2$ (a DC voltage may be supplied to the hollow cathode plasma source) 1 to 10 W/cm$^2$
Gas: Ar, 1,000 sccm+$H_2$, 100 sccm, or Kr or He, 1,000 sccm+ $H_2$, 100 sccm Pressure: 1 to 760 Torr (133 to $10 \times 10^4$ Pa)
Base material temperature: 500±50° C.
Process time: 60 to 600 sec Other Embodiments A hole that forms a microcathode is comparatively thin. Therefore, when acetylene is supplied to the hole from above, contamination caused by sputtering or the like tends to occur readily in the microcathode. In this case, preferably, for example, $H_2$ gas may be supplied together with an inert gas (e.g., krypton) from the upper portion of the plasma source, and acetylene ($C_2H_2$), methane gas, or the like may be supplied from the lower portion of the plasma source, to form a CNT in the microcathode. Furthermore, in order to form a catalyst site for the CNT growth, a gas containing a transition metal such as Ni, Fe, or Co, e.g., $Ni(CO)_4$ or an organic metal gas, may be introduced from below the plasma source.

In order to grow the CNT, a portion added with a catalyst (catalyst site) is often necessary. How to form the catalyst site in the present invention is not particularly limited, and a catalyst site can be formed from, e.g., nickel (for details of catalyst site formation, for example, J. Appl. Phys. 92 6188 (2003) can be referred to).

CNT formation can also be performed by using the apparatuses shown in FIGS. 8, 9, 10, 11, 12, 13, 14, 15, 16, 17, 18, 19, 20, and 21 described above.

Figure 31:
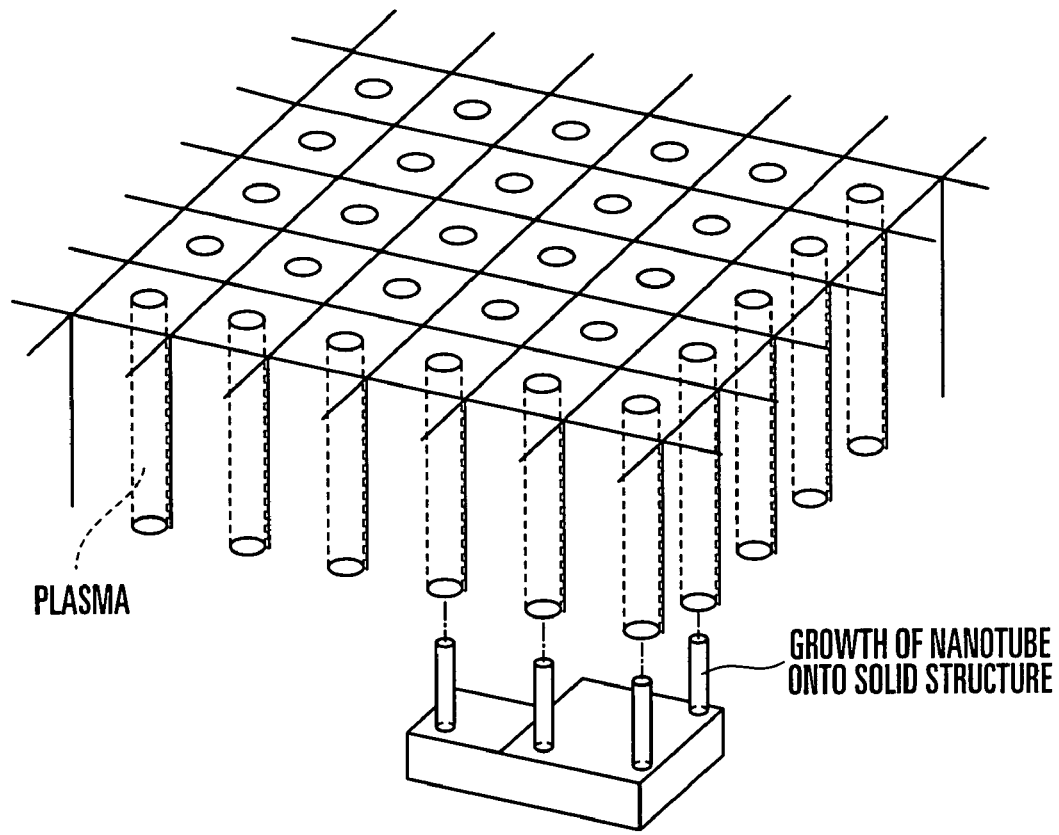
FIG. 31 is a perspective view showing part of the arrangement of the device shown in FIG. 30.
Figure 32:
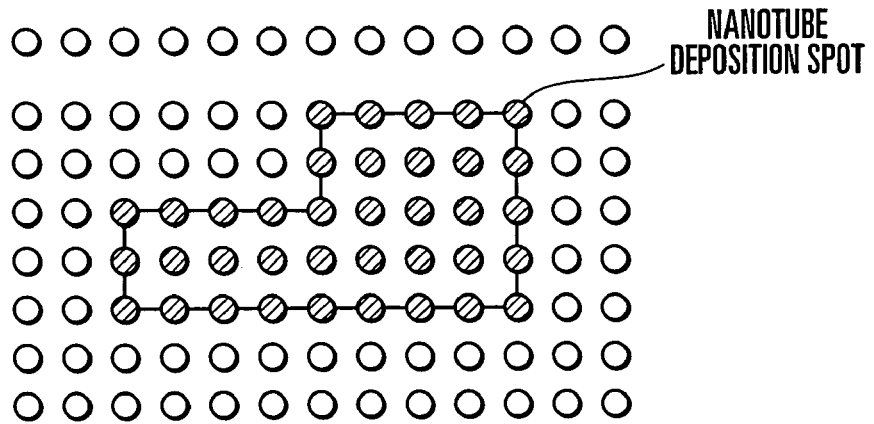
FIG. 32 is a plan view showing part of the arrangement of the device shown in FIG. 30.

For example, when the apparatus shown in FIG. 10 is to be used, voltages can be applied to the respective pairs of electrodes of the three-dimensional multiarray electrodes independently of each other. In the chamber of the plasma processing apparatus which uses a plasma source formed of multiarray electrodes, a sample having a three-dimensional shape is set on the susceptor. A sample having a two- or three-dimensional shape can be processed with a plasma, charged particles, or radicals in accordance with the sample shape (not only two-dimensionally but also three-dimensionally), as shown in, e.g., FIGS. 31 and 32, by controlling the power supply appropriately by FDD.

Practical examples of CNT formation will be described hereinafter.

For example, any one of the various apparatuses described above is used. As the gas (A), $H_2$/Xe gas is introduced under the atmospheric pressure from above the multielectrodes.

Evacuation is performed through the multielectrodes to maintain the pressure in the lower reaction chamber at about 10 Torr. $CH_4/H_2$ or $C_2H_2/H_2$ gas is introduced from the lower electrode to grow a CNT on an Si substrate ($SiO_2$/Si) substrate obtained by depositing Ni on an SiO2 film. The substrate temperature is set to 600° C. The substrate is used as the sample the distance between the multielectrodes and the sample is about 10 mm.

In the multielectrodes, a large amount of H radicals are generated by the reaction of $H_2+e \rightarrow H+H$, $He+e \rightarrow He^+ +e+e$ and introduced into the reaction chamber. The substrate is irradiated with high-speed H radicals with an energy of about 5 eV or less in the same manner as in Example 1.

The interaction of the high-speed H radicals and $CH_3$ or $C_2$ radicals forms a CNT on the substrate. With this method, both the H radical density and the density of $C_2$ or the like become high, and the two types of radicals can be controlled independently of each other. Consequently, a CNT film free from any defect can be formed at a high speed.

Figure 33:
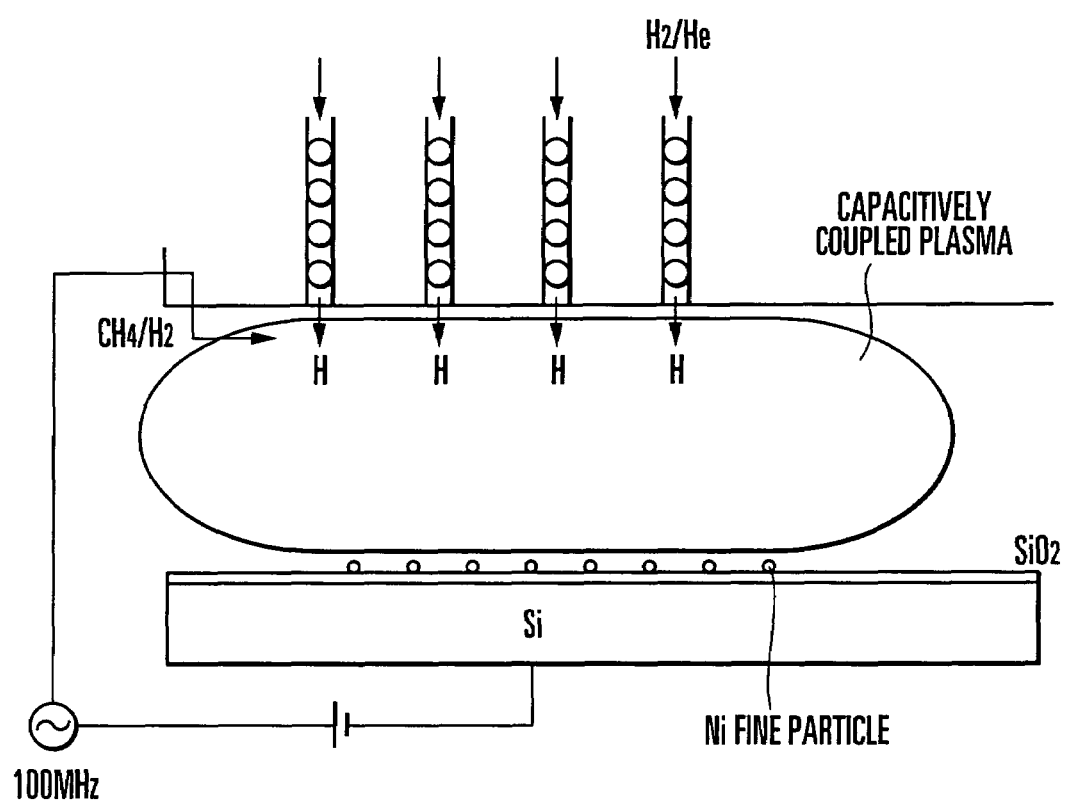
FIG. 33 is a schematic sectional view showing another example of the combination of a plasma source according to the present invention and parallel-plate plasma electrodes.

Furthermore, as shown in FIG. 33, when high-frequency power of 100 MHz is applied between the lowermost electrode of the multielectrodes and the substrate electrode 2, a capacitively coupled gas plasma of $CH_4/H_2$ or $C_2H_2/H_2$ or a gas plasma obtained by adding a gas containing Ni or the like to a gas mixture of $CH_4/H_2$ and $C_2H_2/H_2$, which is excited at 100 MHz, can be applied, and high-density H radicals can be inserted in the plasma.

INDUSTRIAL APPLICABILITY

The present invention can be applied to a processing apparatus such as a plasma CVD apparatus or etching apparatus. The process need not be one which uses a plasma, but the present invention can also be applied to, e.g., catalyst CVD. Furthermore, the process need not use a gas, but the present invention can also be applied to, e.g., sputtering.

The invention claimed is:

1. A plasma processing apparatus characterized by comprising:
    a process chamber;
    base material holding means for arranging a base material at a predetermined position in said process chamber; and
    a plasma source to selectively irradiate a base material with at least one of a plasma, charged particle, and radical, wherein said plasma source includes at least
    a chamber to which a gas should be supplied; and
    a hollow cathode electrode member which is arranged on a gas flow-out side of said chamber and has a plurality of electrode holes through which the gas can flow, and
    said hollow cathode electrode member comprises a plurality of stacked porous hollow cathode electrode members, to which voltage is applied independently and individually, and which are combined through dielectric porous spacers, and microcathode plasma discharge is performed in the electrode holes of said hollow cathode electrode member.

2. A plasma processing apparatus according to claim 1, wherein the base material comprises any one of an electron device base material, optical device base material, and bio-device base material.

3. A plasma processing apparatus according to claim 1, wherein said plasma source comprises an atmospheric-pressure plasma source.

4. A plasma processing apparatus according to claim 1, wherein a gas is supplied into said process chamber.

5. A plasma processing apparatus according to claim 1, wherein any one of an atmospheric-pressure plasma and reduced-pressure plasma is generated in said process chamber.

6. A plasma processing apparatus according to claim 1, wherein a voltage to be applied to said hollow cathode electrode member is changed to irradiate the base material with not less than one type of active species selected from the group consisting of an ion, electron, and radical.

7. A plasma processing apparatus according to claim 1, characterized by comprising:
    base material holding-means for arranging a base material at a predetermined position in said process chamber; and
    coating material supply means for supplying a coating material,
    wherein the base material is irradiated with at least one of a plasma, neutral radical, and positive/negative ion by said plasma source, and
    while the base material is irradiated with at least one of the plasma, neutral radical, and positive/negative ion, a coating layer formed of the coating material is formed on the base material.

8. A plasma processing apparatus according to claim 7, characterized in that while the base material is irradiated with at least one of the plasma, neutral radical, and positive/negative ion, the coating material is supplied onto the base material to form the coating layer.

9. A plasma processing apparatus according to claim 7, wherein a distance between a plasma radiation port of said plasma source and the base material to be processed with the plasma is not more than 5 mm.

10. A plasma processing apparatus according to claim 7, wherein the coating layer is formed by spin coating.

11. A plasma processing apparatus according to claim 1, characterized by comprising:
    base material holding means for arranging a base material at a predetermined position in said process chamber; and
    carbon nanotube formation material supply means for supplying a carbon nanotube formation material,
    wherein the base material is irradiated with at least one of the plasma, neutral radical, and positive/negative ion, and
    while the base material is irradiated with at least one of a plasma, neutral radical, and positive/negative ion, a carbon nanotube formation layer is formed on the base material.

12. A plasma processing apparatus according to claim 11, characterized in that while the base material is irradiated with at least one of the plasma, neutral radical, and positive/negative ion, the carbon nanotube formation material is supplied onto the base material to form the carbon nanotube formation layer.

* * * * *

UNITED STATES PATENT AND TRADEMARK OFFICE
CERTIFICATE OF CORRECTION

PATENT NO. : 7,632,379 B2  
APPLICATION NO. : 10/558692  
DATED : December 15, 2009  
INVENTOR(S) : Goto et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 934 days.

Signed and Sealed this

Twenty-first Day of December, 2010

David J. Kappos
*Director of the United States Patent and Trademark Office*